(12) United States Patent
Sun

(10) Patent No.: US 10,396,808 B2
(45) Date of Patent: Aug. 27, 2019

(54) FRACTIONAL-N PHASE LOCK LOOP APPARATUS AND METHOD USING MULTI-ELEMENT FRACTIONAL DIVIDERS

(71) Applicant: BOARD OF REGENTS, THE UNIVERSITY OF TEXAS SYSTEM, Austin, TX (US)

(72) Inventor: Nan Sun, Austin, TX (US)

(73) Assignee: Board of Regents, The University of Texas System, Austin, TX (US)

( * ) Notice: Subject to any disclaimer, the term of this patent is extended or adjusted under 35 U.S.C. 154(b) by 0 days.

(21) Appl. No.: 16/084,997

(22) PCT Filed: Mar. 15, 2017

(86) PCT No.: PCT/US2017/022462
§ 371 (c)(1),
(2) Date: Sep. 14, 2018

(87) PCT Pub. No.: WO2017/160947
PCT Pub. Date: Sep. 21, 2017

(65) Prior Publication Data
US 2019/0074842 A1    Mar. 7, 2019

Related U.S. Application Data

(60) Provisional application No. 62/308,528, filed on Mar. 15, 2016.

(51) Int. Cl.
*H03L 7/06*    (2006.01)
*H03L 7/197*   (2006.01)
(Continued)

(52) U.S. Cl.
CPC ............. *H03L 7/1974* (2013.01); *H03L 7/06* (2013.01); *H03L 7/089* (2013.01); *H03L 7/091* (2013.01);
(Continued)

(58) Field of Classification Search
CPC ..... H03L 7/1976; H03L 7/093; H03L 7/1974; H03L 7/099; H03L 7/18
See application file for complete search history.

(56) References Cited

U.S. PATENT DOCUMENTS

| 3,286,191 A | 11/1966 | Cornwell |
| 9,484,939 B2 | 11/2016 | Luo et al. |

(Continued)

FOREIGN PATENT DOCUMENTS

WO    2015/172372    11/2015

OTHER PUBLICATIONS

Sanyal, Arindam et al., "Fractional-N PLL with Multi-Element Fractional Divider for Noise Reduction", Electronic Letters, May 12, 2016, vol. 52, No. 10, pp. 809-810.
Yu, X., Sun, Y., Rhee, W. and Wang, Z.: An FIR-Embedded Noise Filtering Method for ΔΣ Fractional-N PLL Clock Generators, IEEE JSSC, pp. 2426-2436, 2009.

(Continued)

*Primary Examiner* — Sibin Chen
(74) *Attorney, Agent, or Firm* — Meunier Carlin & Curfman LLC

(57) ABSTRACT

The exemplified technology provides a circuit and clock synthesis technique that suppresses quantization noise in a ΔΣ fractional-N phase-locked loop (PLL) using a fineresolution multi-element fractional divider. The circuit and clock synthesis method beneficially suppresses noise uniformly over the entire frequency range. The circuit can be implemented using mostly digital circuitry, and is applicable for use with both analog and digital PLLs. With an 8-element fractional divider, it is observed that the circuit and clock synthesis technique can suppress quantization noise while incurring only a small increase in hardware complexity.

20 Claims, 14 Drawing Sheets

(51) Int. Cl.
  *H03L 7/089* (2006.01)
  *H03L 7/091* (2006.01)
  *H03L 7/093* (2006.01)
  *H03L 7/18* (2006.01)

(52) U.S. Cl.
  CPC ........... *H03L 7/093* (2013.01); *H03L 7/18* (2013.01); *H03L 7/197* (2013.01); *H03L 2207/50* (2013.01)

(56) References Cited

U.S. PATENT DOCUMENTS

| | | |
|---|---|---|
| 2004/0145421 A1 | 7/2004 | Mallinson |
| 2008/0084248 A1 | 4/2008 | Heike et al. |
| 2016/0248431 A1* | 8/2016 | Luo .................... G06F 1/04 |

OTHER PUBLICATIONS

Swaminathan, A., Wang, K. J. and Galton, I.: 'A widebandwidth 2.4 GHz ISM-band fractional-N PLL with adaptive phase noise cancellation', IEEE JSSC, pp. 2639-2650, 2007.

Sidiropoulos, S. and Horowitz, M. A.: 'A semidigital dual delay-locked loop', IEEE JSSC, pp. 1683-1692, 1997.

Sun, N.: 'High-order mismatch-shaping in multibit DACs', IEEE TCAS-II, pp. 346-350, 2011.

Sanyal, et al., Fractional-N PLL with multi-element fractional divider for noise reduction, Electronics Letters May 12, 2016 vol. 52 No. 10 pp. 809-810.

International Search Report and the Written Opinion issued for Application No. PCT/US2017/022462, dated Jun. 1, 2017, 9 pages.

International Preliminary Report on Patentability issued for Application No. PCT/US2017/022462, dated Sep. 27, 2018, 7 pages.

* cited by examiner

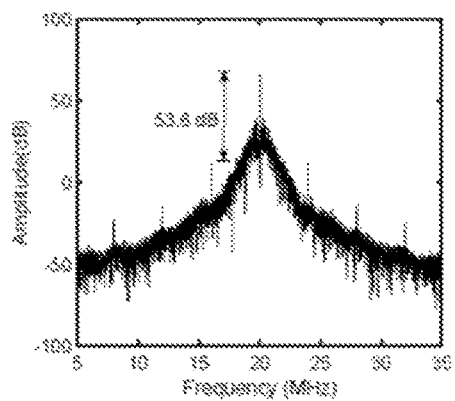 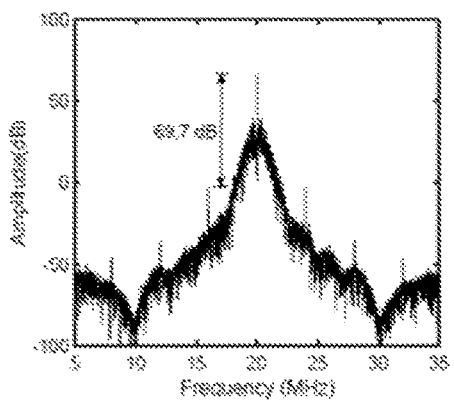
FIG. 15A  FIG. 15B
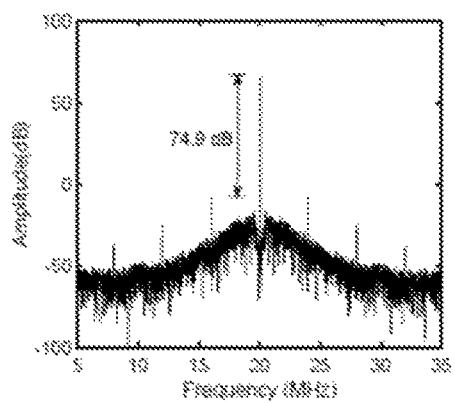 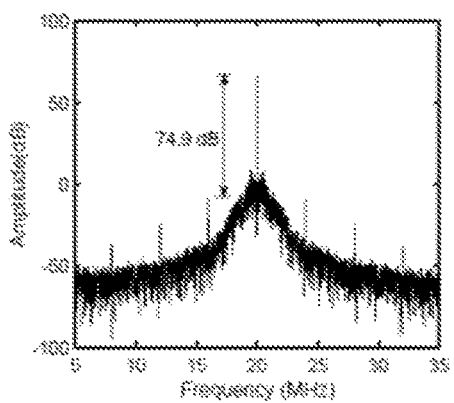
FIG. 15C  FIG. 15D
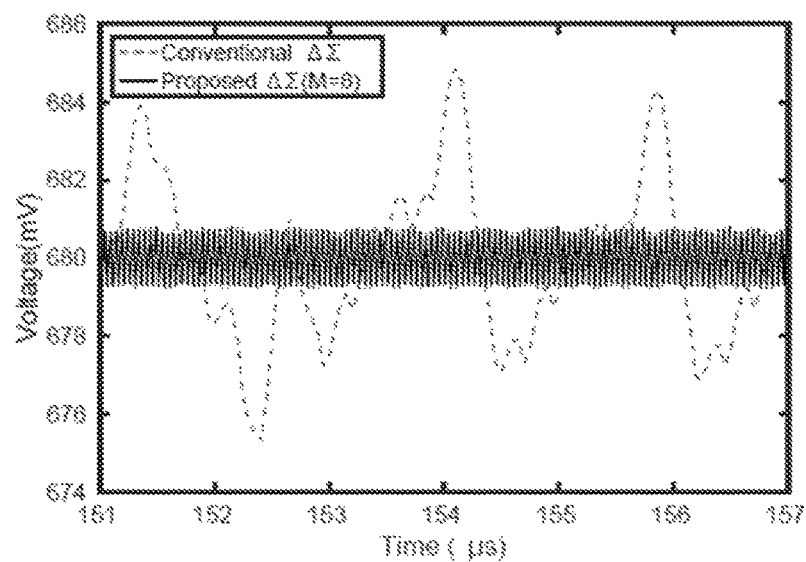
FIG. 16

US 10,396,808 B2

FRACTIONAL-N PHASE LOCK LOOP APPARATUS AND METHOD USING MULTI-ELEMENT FRACTIONAL DIVIDERS

RELATED APPLICATION

This is a 371 application of PCT Application No. PCT/US2017/022462, filed Mar. 15, 2017, titled "FRACTIONAL-N PHASE LOCK LOOP APPARATUS AND METHOD USING MULTI-ELEMENT FRACTIONAL DIVIDERS", which claims priority to, and the benefit of, U.S. Provisional Application No. 62/308,528, filed Mar. 15, 2016, titled "FRACTIONAL-N PHASE LOCK LOOP APPARATUS AND METHOD USING MULTI-ELEMENT FRACTIONAL DIVIDERS," each of which is incorporated by reference herein in its entirety.

BACKGROUND

Fractional-N phase lock loop (PLL) allows synthesis of a signal (for example, for use as a timing and synchronization signal, e.g., a clock signal) having frequency resolution that is a fraction of a reference frequency. Unlike integer-N PLLs, fractional-N PLLs allow synthesis of frequencies which are a fraction of the reference frequency. Thus, a fractional-N PLL can use a higher reference frequency than an integer-N PLL for the same frequency resolution. A high reference frequency typically results in a faster settling time for fractional-N PLLs and better suppression to the noise coming from the PLL oscillator.

One type of fractional-N PLL uses a single divider, at any given time, that changes dynamically between fractional-number values N and N+1 such that the "average" division becomes the desired fraction. Because of the switching between a division value of N and N+1, quantization error are introduced by the modulator used to generate the fractional division ratio. Though loop filters are used to suppress the quantization noise, for certain applications, for example, for a wide-band PLL, the quantization noise can dominate the PLL phase noise and cause large spurs.

There is a need for fractional-N PLLs with improved operational performance

SUMMARY

The exemplified technology provides a circuit and clock synthesis method that suppresses quantization noise in a $\Delta\Sigma$ fractional-N phase-locked loop (PLL) using a fine-resolution multi-element fractional divider. The circuit and clock synthesis method beneficially suppresses noise uniformly over the entire frequency range. The circuit can be implemented using mostly digital circuitry, and is applicable for use with both analog and digital PLLs. With an 8-element fractional divider, to provide spatial averaging, it is observed that the circuit and clock synthesis method can beneficially suppress quantization noise by 18 dB as compared to conventional fractional-N PLLs. In addition, the suppression of quantization noise can be tailored by varying small increases in hardware complexity.

According to an aspect, a frequency synthesizing circuit is disclosed. The frequency synthesizing circuit is configured to synthesize an output signal (e.g., a fractional-N PLL signal or a fractional-N CLK signal), having an output frequency, from an input reference signal (e.g., a CLK analog or digital signal) having an input reference frequency, wherein the output frequency has a multiplication factor (e.g., N+α wherein N is an integer and a is a fraction value) to the input reference frequency. The frequency synthesizing circuit includes a first set of one or more divider circuits (e.g., counter circuit, modulo circuit, and/or digital circuit or logic, e.g., flip-flops, that maintains a counter), each configured to fractionally divide, in a feedback loop of a phase lock loop circuit, the output signal (e.g., of a PLL oscillator of the frequency synthesizing circuit) to generate a first fractional frequency signal, the first fractional frequency signal having a first frequency; a second set of one or more divider circuits, each configured to fractionally divide, in the feedback loop of the phase lock loop circuit, the output signal to generate a second fractional frequency signal, the second fractional frequency signal having a second frequency, wherein the first frequency is not the same as the second frequency, and wherein the fractional frequency signals of the first and second sets of divider circuits are selectively combined (e.g., in output signal; and a selector circuit coupled to each of the plurality of divider circuit, the selector circuit configured to generate (e.g., simultaneously generate) one or more selection signals (e.g., having one or more modulus values) to the first and second sets of divider circuits for selection (e.g., simultaneously selection, e.g., by reconfiguring the division ratio) of the output thereof such that an average distribution of the selection of each of the divider circuits of the first and second sets of divider circuits are the same.

In some embodiments, the fractional frequency signal generated by each of the first set of one or more divider circuits has a division ratio of N+1 to the output frequency, and the fractional frequency signal generated by each of the second set of one or more divider circuits has a division ratio of N to the output frequency. In some embodiments, the output frequency of the output signal has a multiplication factor of N+α value to the input reference frequency of the input reference signal, wherein N is an integer and a is a fraction value.

In some embodiments, each of the first and second sets of one or more divider circuits is reconfigurable with a modulus value of the one or more selection signals.

In some embodiments, the first set of one or more divider circuits includes a k number of divider circuits, each configured to output the fractional frequency signal having the division ratio of N+1 to the output frequency, and the second set of one or more divider circuits includes a k−M number, each configured to output the fractional frequency signal having the division ratio of N to the output frequency, wherein M is a total number of divider circuits.

In some embodiments, the frequency synthesizing circuit includes third set of one or more divider circuits, each configured to output the fractional frequency signal having the division ratio of N+2 to the output frequency.

In some embodiments, the frequency synthesizing circuit includes a fourth set of one or more divider circuits, each configured to output the fractional frequency signal having the division ratio of N−1 to the output frequency.

In some embodiments, the first and second sets of one or more divider circuits, collectively, has an average division ratio of N(1+a), wherein α is a fractional part of the division ratio.

In some embodiments, the selector circuit includes a dynamic element matching (DEM) circuit. In some embodiments, the DEM circuit includes: a barrel shifter circuit (e.g., digital logic circuits) configured to high-pass shape mismatch errors, among an input modulator signal (e.g., from a delta-sigma modulator circuit), to the first order. In some embodiments, the DEM circuit includes a vector quantizer circuit or a tree-structured circuit (e.g., digital logic circuits)

configured to shape mismatch error, among an input modulator signal (e.g., from a delta-signal modulator circuit), to higher orders.

In some embodiments, the selector circuit includes a dynamic element matching (DEM) circuit; and a fractional delta-sigma modulator circuit (e.g., a delta-sigma converter) coupled thereto.

In some embodiments, the fractional delta-sigma modulator is configured to generate a modulated signal, the modulated single being scrambled by the dynamic element matching (DEM) circuit, such that the average of the division ratio for each divider is identical, to generate the one or more selection signals.

In some embodiments, the output signal includes a fractional-N PLL (phase-lock loop) signal or a fractional-N CLK (clock) signal.

In some embodiments, the output signal comprises an analog signal.

In some embodiments, the output signal comprises a digital signal.

In some embodiments, a combined number of dividers of the first and second sets of the divider circuits is a number selected from the group consisting of 4, 5, 6, 7, 8, 9, 10, 11, 12, 13, 14, 15, 16, 17, 18, 19, 20, 21, 22, 23, 24, 25, 26, 27, 28, 29, 30, 31, and 32. In some embodiments, the combined number of dividers is greater than 32.

In some embodiments, the plurality of divider circuits and the selector circuit are implemented in an integrated circuit selected from the group consisting of an application specific integrated circuit (ASIC), a field programmable gate array (FPGA), a complex programmable logic device (CPLD), and a microprocessor configured with reconfigurable integrated circuits.

In some embodiments, the plurality of divider circuits and the selector circuit are implemented in a monolithic integrated circuit.

In some embodiments, the frequency synthesizing circuit includes a third set of one or more divider circuits, each configured to fractionally divide, in the feedback loop of a phase lock loop circuit, the output signal to generate a third fractional frequency signal, the third fractional frequency signal having a third frequency, and a fourth set of one or more divider circuits, each configured to fractionally divide, in the feedback loop of the phase lock loop circuit, the output signal to generate a fourth fractional frequency signal, the fourth fractional frequency signal having a fourth frequency, wherein the fractional frequency signals of the first, second, third, and fourth sets of divider circuits are selectively combined to generate the output signal.

In some embodiments, each of the third set of one or more divider circuits is configured to output the fractional frequency signal having the division ratio of N−1 to the output frequency, and wherein each of the fourth set of one or more divider circuits is configured to output the fractional frequency signal having the division ratio of N+2 to the output frequency.

In some embodiments, the frequency synthesizing circuit of claim 1 includes, in the feedback loop, a plurality of phase frequency detectors, each having an input that is coupled to an output of a respective divider circuit of the first and second sets of one or more divider circuits; a plurality of charge pump element, each having an input that is coupled to an output of a respective phase frequency detector of the plurality of phase frequency detectors; a loop filter having an input coupled to an output of the plurality of charge pump element; and a voltage controlled oscillator having an input coupled to an output of the loop filter, wherein an output of voltage controlled oscillator is coupled to an input of the first and second sets of one or more divider circuits.

In some embodiments, the frequency synthesizing circuit includes, in the feedback loop, a plurality of time-to-digital converters (TDCs), each having an input that is coupled to an output of a respective divider circuit of the first and second sets of one or more divider circuits; a plurality of digital summer elements, each having an input that is coupled to an output of a respective time-to-digital converters of the plurality of time-to-digital converters; a loop filter having an input coupled to an output of the plurality of digital summer elements; and a digitally controlled oscillator (DCO) having an input coupled to an output of the loop filter, wherein an output of the digitally controlled oscillator is coupled to an input of the first and second sets of one or more divider circuits.

In some embodiments, the time-to-digital converter (TDC) is configured to support a wide swing covering at least one VCO period, and wherein the time-to-digital converter has a resolution and linearity in which quantization noise is prevented from folding into a PLL band.

In some embodiments, instantaneous transition rate of any capacitor of the digitally controlled oscillator is ensured to be independent of digital control signal associated with the frequency synthesizing circuit.

In some embodiments, the digitally controlled oscillator includes a feedback loop that guarantees that the all capacitor elements are used uniformly to simultaneously suppress static mismatch error associated therewith.

In some embodiments, rising edges of outputs of the first and second set of one or more divider circuits are shaped to be similar to reference clock rising edges so as to ensure that all phase-frequency detectors (PI-Ds) work in the linear region (e.g., from −2π to 2π).

In some embodiments, rising edges of outputs of the first and second set of one or more divider circuits are shaped to be identical to reference clock rising edges so as to ensure that all In some embodiments, every divider output frequencies is configured to be identical to a reference clock.

According to another aspect, a method is disclosed for synthesizing an output signal (e.g., a PLL or CLK signal), having an output frequency, from an input reference signal having an input reference frequency, wherein the output frequency has a multiplication factor (e.g., N+α, wherein N is an integer and a is a fraction value) to the input reference frequency. The method includes, fractionally dividing, in a feedback loop of a phase lock loop circuit, an output signal (e.g., of an PLL oscillator of frequency synthesizing circuit) to generate a first fractional frequency signal, the first fractional frequency signal having a first frequency; fractionally dividing, in the feedback loop of the phase lock loop circuit, the output signal to generate a second fractional frequency signal, the second fractional frequency signal having a second frequency, wherein the first frequency is not the same as the second frequency, and wherein the first fractional frequency signals and second fractional frequency signals are selected such that an average distribution of the selection of each of the first fractional frequency signals and second fractional frequency signals are the same; and combining the selected first fractional frequency signals and second fractional frequency signals (e.g., via a frequency synthesizing portion of the fractional-N PLL circuit) to generate an output signal (e.g., a PLL or CLK signal).

In some embodiments, the method includes simultaneously generating (e.g., via a dynamic element matching (DEM) circuit) a signal to select, at each given period, one or more first fractional frequency signals and second fractional frequency signals, wherein the generated signals has an average distribution among the selection of each of the first fractional frequency signals and second fractional frequency signals that are the same to one another.

According to another aspect, a fractional-N phase lock loop circuit (e.g., configured to synthesize a signal having frequencies that are fractions of that of a reference signal) is disclosed. The fractional-N phase lock loop circuit includes a multi-element fractional divider comprising a plurality of fractional divider circuit; and a dynamic element matching (DEM) circuit coupled to each of the plurality of fractional divider circuits.

BRIEF DESCRIPTION OF DRAWINGS

Embodiments of the present invention may be better understood from the following detailed description when read in conjunction with the accompanying drawings. Such embodiments, which are for illustrative purposes only, depict novel and non-obvious aspects of the invention. The drawings include the following figures:

FIGS. 15A, 15B, 15C, and 15D are diagrams illustrating simulated results comparing VCO output spectrums in a conventional ΔΣ modulator (FIG. 15A), a ΔΣ modulator with 8-tap FIR filter (FIG. 15B), the fractional-N phase lock loop circuit of FIG. 7 (FIG. 15C), and the fractional-N phase lock loop circuit of FIG. 7 with 3σ mismatch (FIG. 15D).

FIG. 16 depicts a diagram of a simulated result of a VCO control voltage transient, of the fractional-N PLL of FIG. 6, at lock.

DETAILED SPECIFICATION

Each and every feature described herein, and each and every combination of two or more of such features, is included within the scope of the present invention provided that the features included in such a combination are not mutually inconsistent.

The methods and apparatuses disclosed herein facilitates designs of fractional-N PLLs and fractional-N DPLLs having multiple divider elements that allow synthesis of an output signal having frequencies that are a fraction of an input reference frequency with low quantization error from a ΔΣ modulator used to generate the fractional division ratio. In some embodiments, the quantization error is −18 dB (decibels) less than those of conventional fractional-N PLLs. In addition, the suppression of quantization noise can be tailored by varying small increases in hardware complexity. In addition, the methods and apparatuses allows a high input reference frequency and a wide PLL bandwidth, which beneficially provides both fast settling time and strong suppression of VCO (voltage-controlled oscillator) noise.

Fractional-N PLL with Fractional Division Ratio N+α

Figure 1:
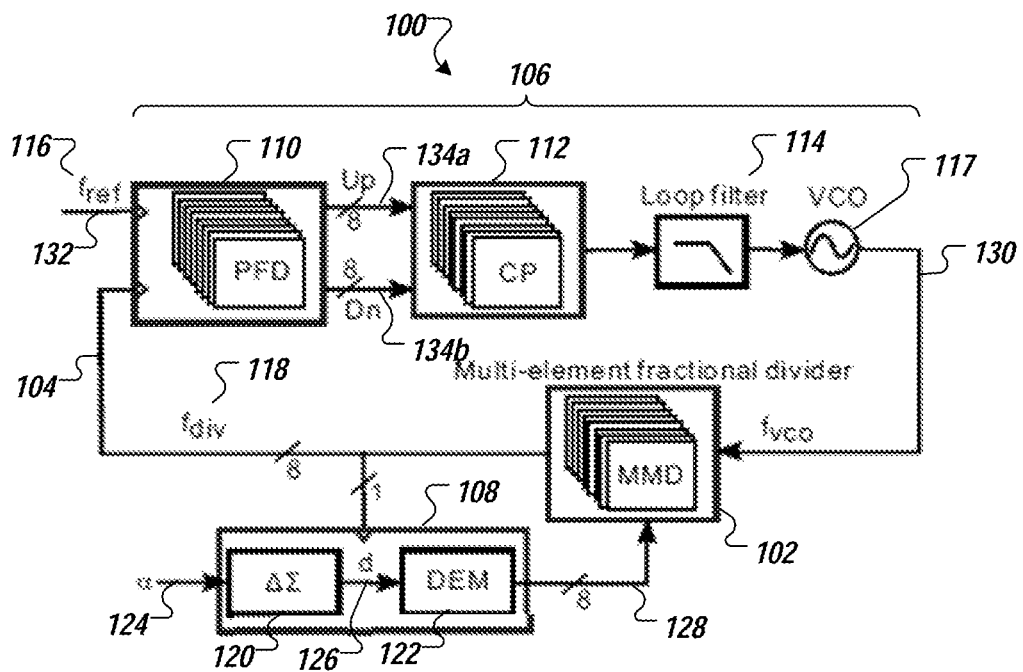
FIG. 1 is a diagram of a fractional-N phase lock loop circuit having multiple divider components, in accordance with an illustrative embodiment.

FIG. 1 is a diagram of a fractional-N phase lock loop circuit 100 having multiple divider elements 102, in accordance with an illustrative embodiment.

The multiple divider elements 102 are arranged, in a feedback loop 104, with a synthesizer portion 106 of the circuit 100. In some embodiments, the multiple divider elements 102 are arranged in parallel in an array. In some embodiments, the array is implemented as a multi-modulus dividers (MMD) having 3, 4, 5, 6, 7, 8, 9, 10, 12, 13, 14, 15, or 16 dividing elements. In some embodiments, the multi-modulus dividers (MMDs) has more than 16 dividing elements, for example, 17, 18, 19, 20, 21, 22, 23, 24, 25, 26, 27, 28, 29, 30, 31, or 32 dividing elements. In some embodiments, the multi-modulus dividers (MMDs) has more than 32 elements.

The multiple divider elements 102 are coupled to a selector circuit 108 that selects the outputs of the divider circuits 102 such that an average distribution of the selection of each of the divider circuits are the same. In some embodiments, the synthesizer portion 106 includes a plurality of phase-frequency detectors 110, a plurality of charge pumps 112, a loop filter 114, and a voltage-controlled oscillator 117.

Referring still to FIG. 1, the fractional-N phase lock loop circuit 100 generates an output signal 130 having a division ratio of N+α from an input reference signal 116. For example, the fractional-N phase lock loop circuit 100 may be used to generate an output signal having a frequency of 212 MHz, via division ratio of 10.6, when a 20 MHz input frequency signal is provided (i.e., 20 MHz*10.6=212 MHz, where N=10, and α=0.6). To this end, it is contemplated that any division ratio N+α may be generated using any fractional value of α in the exemplified method and apparatus.

Referring still to FIG. 1, the multiple divider elements 102 include, at least, a first and second sets of one or more divider circuits (not shown—see FIG. 5) (e.g., counter circuit, modulo circuit, and/or digital circuit or logic, e.g., flip-flops, that maintains a counter), each configured to fractionally divide, in a feedback loop 104, an input reference signal (namely, the output signal 130) to generate a fractional frequency signal 118.

Each set of divider circuits is configured to generate a fractional frequency signal having a fractional frequency different from those generated by the other set of divider circuits. In some embodiments, the first set of one or more divider circuits is configured to generate a first fractional frequency signal, having a first frequency, using a first division ratio (e.g., N) and the second set of one or more divider circuits is configured to generate a second fractional frequency signal, having a second frequency, using a second division ratio (N+1). To realize the fractional α ΔΣ modulator that generates quantization steps that are in fractional values (e.g., 1/8, 2/8, 3/8 . . . and 7/8 for a 8-bit modulator). The decreased quantization steps beneficially provide noise reduced operations. To demonstrate the operation of the fractional-N phase lock loop with two sets of one or more divider circuits, assume a fractional-N phase lock loop with an effective division ratio of 10.6, as an example, is desired. That is, the fractional-N phase lock loop is configured to multiply the frequency $F_{ref}$ of an input reference signal by 10.6×$F_{ref}$. The division ratio of 10.6 can be used to generate a reference signal having a frequency of 212 MHz when a 20 MHz input frequency signal is provided (i.e., 20 MHz*10.6=212 MHz).

In this example, assume that 8 divider circuits are implemented to provide two fractional division ratios of 10.5 and 10.625 in which the 8 divider circuits are divided into two groups, a first group having a division ratio of N (e.g., having a value of "10") and a second group having a division ratio of N+1 (e.g., having a value of "11"). By switching between fractional division ratios of 10.5 and 10.625 by selectively using the outputs of the 8 divider circuits, the respective difference (i.e., error) between the switched fractional division ratio (e.g., 10.5 and 10.625) and the desired division ratio (e.g., 10.6) is reduced as compared to a conventional fractional-N PLL that uses a integer divider (which may switch between "10" and "11"). This error is referred to as quantization error. It is observed that the reduced quantization error, in some embodiments, is 18 dB lower for a 8-element divider as compared to a conventional fractional-N PLL that uses a single divider to switch between N and N+1.

To generate a division ratio of 10.5 in the above example, four of the divider circuits 102, collectively, forming the first group, are configured with a division ratio of 10 (namely, N) and the remaining 4 divider circuits, collectively, forming the second group are configured with a division ratio of 11 (namely, N+1). When an equal distribution of the divider circuits are selected, i.e., via the selector circuit, the average division ratio is 10.5. In a similar manner, to generate a division ratio of 10.625, three of the divider circuits 102 of the first group are configured with a division ratio of 10 and the remaining five divider circuits forming the second group are configured with a division ratio of 11. When an equal distribution of the divider circuits are selected the average division ratio is 10.625.

As stated above, to realize the fractional division ratio, the divider circuits 102 are controlled by a selector circuit 108 having a ΔΣ modulator 120 that generates quantization steps that are in fractional values (e.g., 1/8, 2/8, 3/8 . . . and 7/8 for a 8-bit modulator). The decreased quantization steps beneficially provide noise reduced operations. To ensure that the exemplified PLL is locked, in some embodiments, each divider slice (e.g., of 102) has to maintain an average division ratio of N+α, where N which is integer part, and α is the fractional part.

Referring still to FIG. 1, the selector circuit 108 includes a fractional delta-sigma (ΔΣ) modulator 120 (also referred to as the "fractional ΔΣ modulator 120" or "ΔΣ modulator 120") coupled to the dynamic element matching (DEM) circuit 122. The fractional ΔΣ modulator 120 is configured to receive a fractional value α input 124 for the fractional division ratio of N+α. In some embodiments, the fractional value α input 124 is an analog or digital signal expressed in terms of a pre-defined magnitude, byte value, and the like. As shown in FIG. 1, the fractional ΔΣ modulator 120 is configured to generate a modulated signal 126 (shown as "d" 126), which is scrambled by a dynamic element matching (DEM) circuit 122, to produce a selection signal 128 that triggers the selection of an output of the divider circuits 102 such that the average selection of the division ratio for each divider is identical (i.e., that the average division ratio is N+α).

Figure 2:
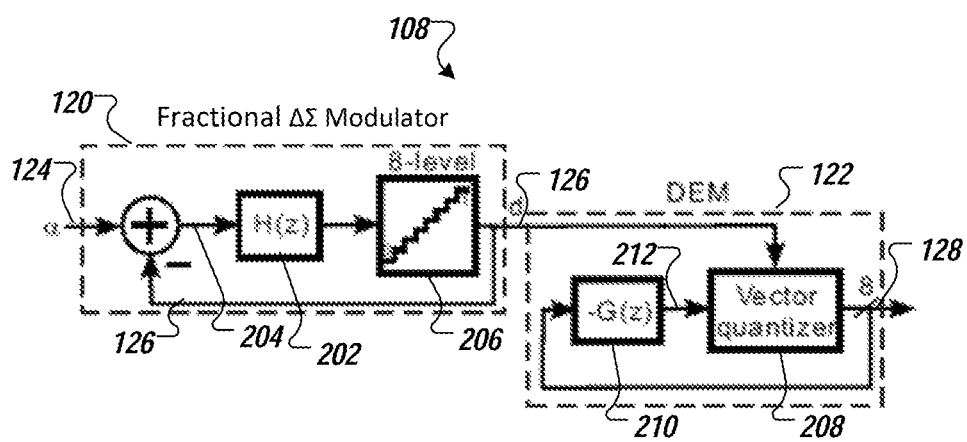
FIG. 2 is a diagram of a selector circuit 108 of the fractional-N phase lock loop circuit, in accordance with an illustrative embodiment.

FIG. 2 is a diagram of a selector circuit 108 of the fractional-N phase lock loop circuit, in accordance with an illustrative embodiment. As shown, the selector circuit 108 includes the fractional ΔΣ modulator 120 coupled to the dynamic element matching (DEM) circuit 122. The ΔΣ modulator 120 includes an integrator 202 to integrate a difference signal 204 generated from the fractional value α input 124 and the output modulated signal 126 from an output (as a feedback output) of a quantizer 206 of the fractional ΔΣ modulator 120.

As discussed, the DEM circuit 122 scrambles the divider selection to ensure that the average distribution of the division ratio for each divider is identical. In addition, the DEM circuit 122 concurrently suppresses mismatch error among each charge-pump slice. In FIG. 2, the DEM circuit 122 uses a feedback structure (shown as "−G(z) 210") (e.g., a $$\frac{1}{(1-z^{-1})}$$

block) to provide as an input 212 to the vector quantifier 208 to ensure that all vector variables in the feedback structure are bounded. In addition, the vector quantifier 208 receives the modulated signal 126 and stores the signal as vector variables. In some embodiments, the DEM circuit 122 comprises a barrel shifter to maintain the vector variables.

The feedback shifts selection of the vector states in the barrel shifters such that the average distribution of the selection is identical.

Figure 3:
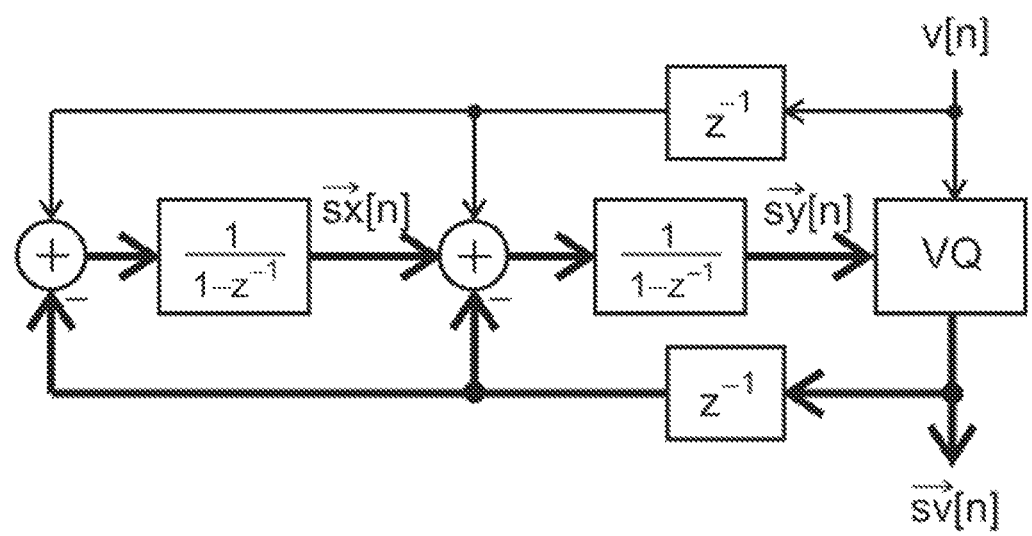
FIG. 3 is an example dynamic element matching (DEM) circuit of the selector circuit of FIG. 2.
Figure 4:
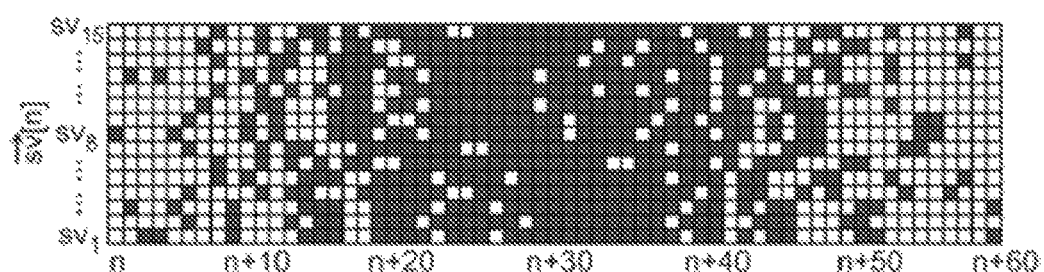
FIG. 4 is an example sequence of vector states for the dynamic element matching (DEM) circuit of FIG. 2.

FIG. 3 is an example dynamic element matching (DEM) circuit of the selector circuit of FIG. 2. As shown in FIG. 3, the DEM circuit is configured to decode v[n] into vector sv[n]. FIG. 4 is an example sequence of vector states for the DEM circuit of FIG. 2. As shown in FIG. 4, the vector quantizer maintains an example 60 vector states having an input amplitude A value of 0.85.

It is contemplated that other selection circuits may be used. For example, tree-structured DEM circuit can be used. Without wishing to be bound to a particular implementation, examples of other DEM circuits are described in Sun, N., "High-order mismatch-shaping in multibit DACs", IEEE Trans. Circ. & Sys.-II, pp. 346-350, 2011, the text of which is incorporated by reference herein in its entirety.

Referring back to FIG. 1, the synthesizer portion 106 includes a plurality of phase-frequency detectors 110 (shown as "PFD" 110), a plurality of charge pumps 112 (shown as "CP" 112), a loop filter 114, and a voltage-controlled oscillator 117 (shown as "VCO" 117). As shown in FIG. 1, each of the phase-frequency detectors (PFDs) 110 is coupled to an output of a respective multiple divider element 102 and an input reference line 132 associated with an input reference signal 116. Each phase-frequency detector 110 is configured to compare the input reference signal 116 with a corresponding fractional frequency signal 118, from a corresponding divider 102, to determine phase differences therebetween to output a signal (shown as 134a and 134b) to activate a given charge pump 112. The charge pumps 112, in essence, sums up the outputs of each phase-frequency detector 110, which corresponds to the outputs of each divider circuit. To this end, the divider outputs are effectively summed up in the charge or current domain. So that the original charge pump current are consumed, as compared to a single divider topology, each slice of the charge pump is configured to consume only 1/number of divider portions of the pump current. For example, for an 8-divider circuit implementation, the charge pump consumes only 1/8 of the original charge pump current.

The phase-frequency detectors (PFD) 110 and charge pumps 112, in some embodiments, for each channel corresponding to a given divider, operate in frequency detect, phase detect, and phase locked modes. In some embodiments, in the frequency detect mode, each charge pump 112 outputs a constant current. In some embodiments, in the phase detect mode, each charge pump 112 outputs at each phase-frequency detector cycle that is proportional to the phase difference between the input signals 116, 118. In some embodiments, in the phase locked state, each phase-frequency detector 110 outputs an impulse (e.g., a "spike") at a frequency equal to an input reference frequency of the input reference signal 116.

Referring still to FIG. 1, the output of the charge pumps 112 are received as input to the loop filter 114, which provides an output to the voltage-controlled oscillator (VCO) 117. The loop filter 114, in some embodiments, is configured to respond to disturbances, such as changes in the reference frequency, changes of the feedback divider, or at startup, and to limit reference spurs. The voltage-controlled oscillator (VCO) 117, in some embodiments, are positive feedback amplifiers that have a tuned resonator in the feedback loop.

Fractional-N PLL with Fractional Division Ratio N+α with Dual Level Division

Figure 5:
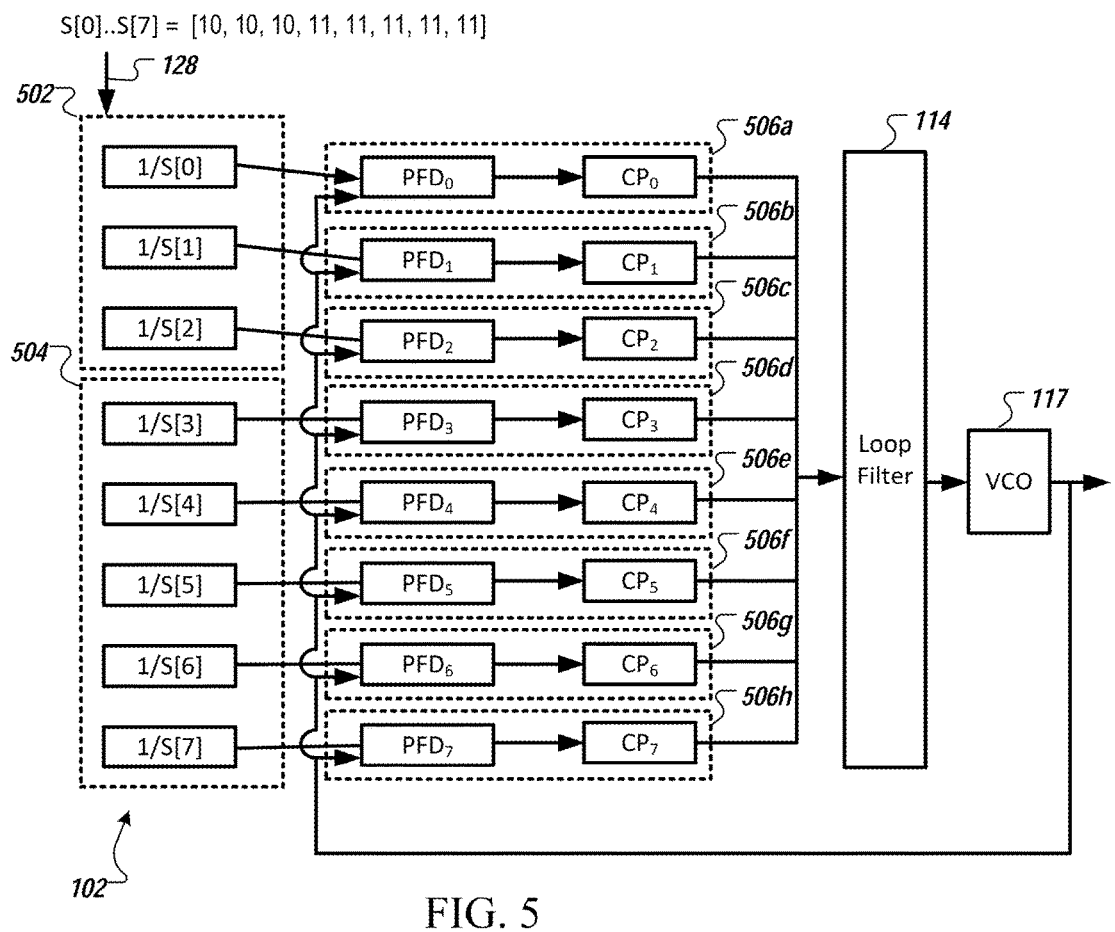
FIG. 5 is a diagram of the fractional-N phase lock loop circuit of FIG. 1 having multiple duo-modulo divider elements, in accordance with another illustrative embodiment.

FIG. 5 is a detailed view of FIG. 1 to illustrate fractional-N PLL with multiple divider accordance with the illustrative embodiment. In some embodiments, each divider element is implemented as a counter circuit, a modulo circuit, a digital integrated circuit or logic integrated circuit, e.g., flip-flops, that maintains a counter.

As shown in the FIG. 5, the multiple divider elements 102 include divider circuits, each reconfigurable, via the selection signal 128, to form a divider circuit configured with modulo value specified by a given selection value. As shown, the selection signal includes an array having a value of "10, 10, 10, 11, 11, 11, 11, 11". To this end, three divider elements, forming a first group 502, are reconfigured with the value of "10" (i.e., N) and five divider elements, forming a second group 504, are reconfigured with the value of "11" (i.e., N+1). To ensure that the PLL is locked, each divider slice has to maintain an average division ratio of N+α.

As shown in FIG. 5, each multiple divider elements 102 are coupled to identical slices 506 (shown as 506a, 506b, 506c, 506d, 506e, 506f, 506g, and 506h) having a phase-frequency detector (shown as "PFD$_0$" to "PFD$_7$") and charge pump (shown as "CP$_0$" to "CP$_7$"). The output of each charge pump 506 is a current, which are summed, as input to the loop filter.

Fractional-N PLL with Fractional Division Ratio N+α with Multiple Level Division In some embodiments, the multiple divider elements 102 include additional sets of one or more divider circuits, each configured to output the fractional frequency signal having other division ratios besides N and N+1.

For example, in some embodiments, multiple divider elements 102 include a third set of one or more divider circuits having, e.g., a division ratio of N+2, and/or a fourth set of one or more divider circuits having, e.g., a division ratio of N−1, which may be controllably switched with the first set of one or more divider circuits and the second set of one or more divider circuits. It is contemplated that this topology may be beneficial in implementing fractional-N PLLs having division ratios where absolute value of α is very small in magnitude (e.g., 0.001, 0.0001, 0.999, or 0.9999). As discussed in relation to FIG. 1, certain ΔΣ modulator includes an output modulated signal. When the absolute value of α is very small, the ΔΣ modulator can be unstable if its output is confined to only 2 levels. This is a common problem for a 2-level high-order ΔΣ modulator. A multiple level division configuration (e.g., those having one or more of N+2, N+3, N+4, N+5, ..., N+z, N−1, N−2, N−3, ... N−z, where z is an integer) may be used to facilitate the operation of the fractional ΔΣ modulator in a stable regime. That is, for each given time instance, the division ratio may be selected between i) a first configuration having a first and second set of dividers and ii) a second configuration having a first and third set (or fourth set) of dividers. Take, for example, for a division ratio of 10.001, the multiple level division configuration may be arranged to allow for switching between two groups of division ratios among division ratios of 9.75, 10, and 10.25 (e.g., for a 4-element MMD) or between two groups of division ratios among division ratios of 9.875, 10, and 10.125 (e.g., for an 8-element MMD).

Referring to FIG. 5, to generate the division ratio of 9.875, a first group of seven divider circuits is each configured with a modulus of, e.g., N (i.e., "10"), a second group 604 of one divider circuit is configured with a second modulus of, e.g., N−1 (i.e., "9"). Consequently, to generate the division ratio of 10.125, a first group of one divider circuit is configured with a modulus of N (i.e., "10"), a second group of seven divider circuits is configured each with a second modulus of, e.g., N+1 (i.e., "11"). Then, subsequently, to generate the 10.001 division ratio, the first configuration is selected 49.8 percent of the time and the second configuration is selected 50.2 percent of the times.

Fractional-N PLL with Fractional Division Ratio N+K/M

Figure 6:
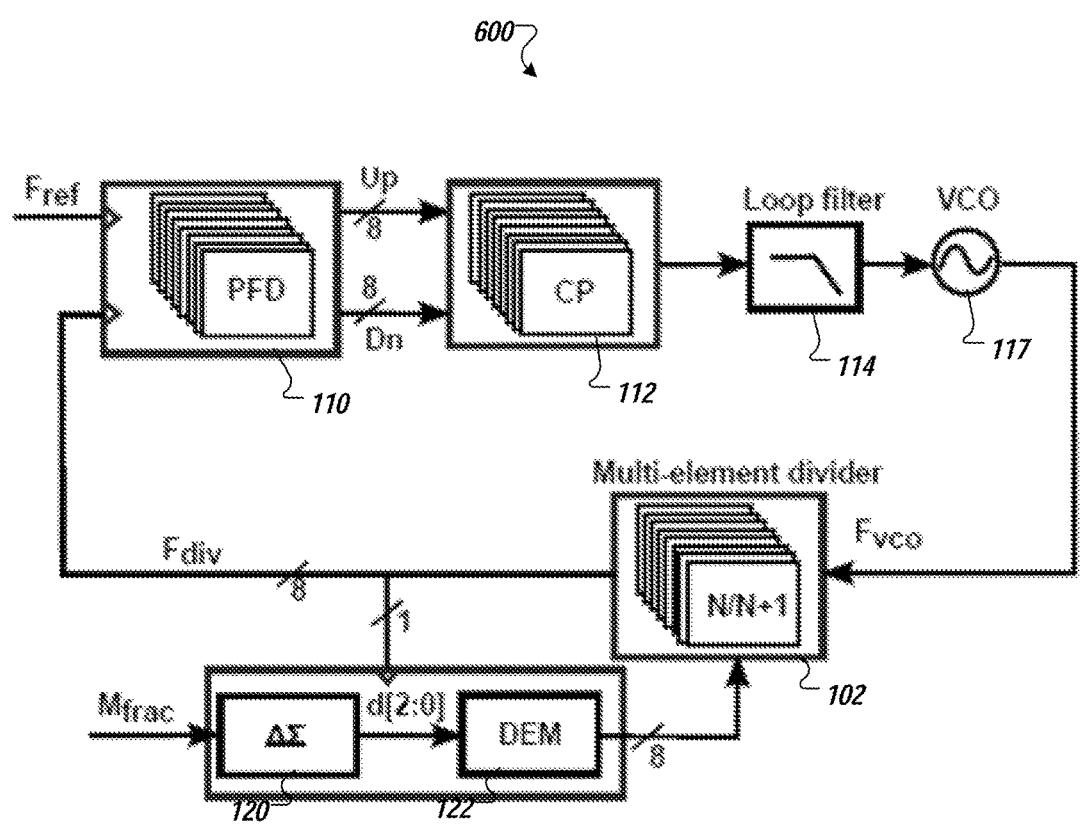
FIG. 6 is a diagram of a fractional-N phase lock loop circuit having multiple divider components configured with division ratio N+J/K, in accordance with an illustrative embodiment.

FIG. 6 is a diagram of a fractional-N phase lock loop circuit 600 having multiple divider components 102 configured with division ratio N+K/M, in accordance with an illustrative embodiment. The fractional-N PLL 600 has a fractional division ratio of N+K/M, where N, K, and M are all integers. In addition, K<M. The fractional-N PLL 600 includes a first group of K dividers each with modulus N+1 and a second group of M−K dividers each with modulus of N. dividers into M identical N=N+1 dividers, and choosing K dividers with modulus of N+1 and the remaining (M−K) dividers with modulus of N. To synthesize an arbitrary fractional division ratio of N+K/αM, a ΔΣ modulator 120 with M-element quantizer is used. During operation, the ΔΣ modulator 120 is configured to produce a series of coarse division ratios whose long term average equals to α in which the step in the division ratio is not 1, but rather 1/M. The ΔΣ modulator 120 ensures that on an average (K+α) dividers are chosen with modulus of (N+1) and the (M−K−α) dividers are chosen with modulus of N.

As shown in FIG. 6, the fractional-N PLL 600 effectively increases the resolution of the ΔΣ modulator 120 by M and suppresses the quantization noise by 20 log$_{10}$ M in dB scale. The dividers 102, phase-frequency detectors (PFD) 110, and charge-pumps 112 are all split into M identical elements. To ensure that the PLL is locked, each divider 102 has to maintain a same average division ratio of N(1+M$_{frac}$). In some embodiments, a dynamic element matching (DEM) block 122 is inserted after the ΔΣ modulator 120 which scrambles the divider selection to ensure that each divider 102 has an average division ratio of N(1+M$_{frac}$). The DEM 122 brings an additional benefit in that the mismatch between each element in the charge-pump 112 is suppressed. In some embodiments, the dynamic element matching (DEM) 122 is implemented as a barrel shifter to shape the mismatch errors to first order. In another embodiment, a vector quantizer is implemented to shape the mismatch errors to higher order (e.g., greater or equal to "2").

To properly select which k dividers to have the division ratio of N+1 and select which (M−k) dividers to have the division ratio of N, the proper selection pattern must be generated. As stated above, in some embodiments, the dynamic element matching (DEM) 122 is implemented as a barrel shifter. A barrel shifter, in some embodiments, is configured to shift, via combinational logic, a data word by a specified number of bits without the use of any sequential logic. A barrel shifting selection pattern, generated via a data weighted averaging (DWA), is shown in Table 1, to generate an example fractional division ratio of 3.25.

TABLE 1

| | Reference clock period | | | |
|---|---|---|---|---|
| Division ratio | 4K | 4K + 1 | 4K + 2 | 4K + 3 |
| Divider #1 | 4 | 3 | 3 | 3 |
| Divider #2 | 3 | 4 | 3 | 3 |
| Divider #3 | 3 | 3 | 4 | 3 |

TABLE 1-continued

| | Reference clock period | | | |
|---|---|---|---|---|
| Division ratio | 4K | 4K + 1 | 4K + 2 | 4K + 3 |
| Divider #4 | 3 | 3 | 3 | 4 |
| Average division ratio | 3.25 | 3.25 | 3.25 | 3.25 |

As shown in Table 1, the division ratio pattern is different for every divider, though the summary of the division ratios is "13" for any divider after 4 reference clock periods to ensure that the output frequency of each divider is the same. Table 1 also shows that the 1 divider performs a division of "4", and 3 dividers performs a division of "3", to produce a same spatial average of 3.25, for each given clock period, over time. To this end, fractional division ratio of 3.25 is achieved at any time instance, which helps substantially reduce quantization error and greatly attenuate ripples.

Figure 7:
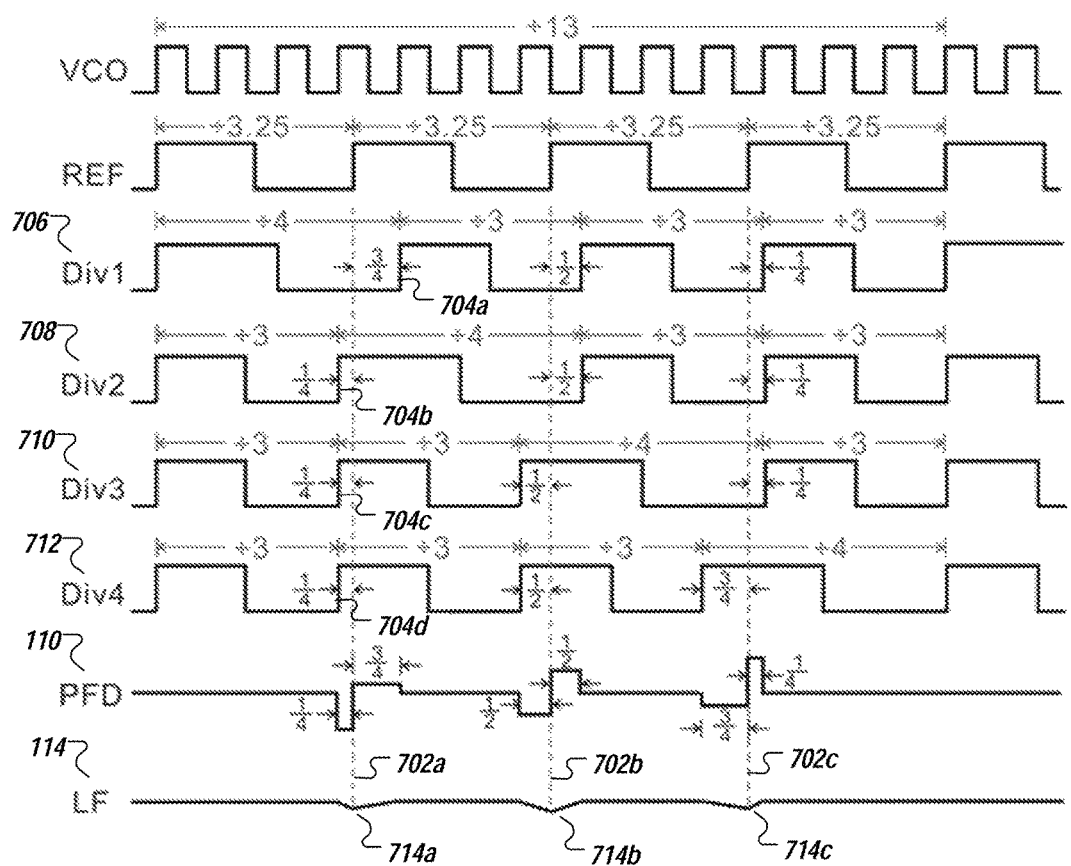
FIG. 7 shows a time-domain waveform of the fractional-N PLL of Table 1.

FIG. 7 shows a time-domain waveform of the fractional-N PLL of Table 1. As shown in FIG. 7, lines 702a, 702b, and 702c indicate locations of rising edges of the reference clock. In some embodiments, the edges may not align with the rising edge of any individual divider, but are aligned at the arithmetic means of rising edges of the dividers. For example, at line 702a, the rising edge (704a) of divider circuit #1 (706) (shown as "Div 1" 706) is shown lagging by 3/4 VCO clock cycle, the rising edges (shown as 704b, 704c, and 704d) of dividers circuit #2 (shown as "Div 2" 708), #3 (shown as "Div 3" 710), and #4 (shown as "Div 4" 712) are each leading by 1/4 VCO clock cycle, to provide an arithmetic mean at line 702a. To this end, the four dividers (706, 708, 710, and 712) can collectively viewed as a single divider that is aligned with the reference clock.

It is contemplated that further advantage of the exemplified fractional-N PLL (e.g., 600 of FIG. 6) is that the loop filter sees a much smaller swing than the loop filter in a conventional ΔΣ fractional-N PLL. This is because the ΔΣ modulator quantization noise has been greatly reduced. Thus, ripple in the VCO control voltage may be approximately M times smaller than in a conventional fractional-N PLL.

Referring still to FIG. 7, the corresponding outputs of the phase-frequency detector 110 (shown as "PFD" 110) and loop filter 114 (shown as "LF 114") are also shown. Although ripples on the loop filter (LF) 114 (shown as 714a, 714b, and 714c) are caused by individual phase misalignment, the amplitude of the ripple at the loop filter (LF) output is negligible and the width of each ripple is at the frequency of the reference clock (only 1 VCO clock period in this example). Thus, the ripple is at a much higher frequency and can be substantially attenuated by the PLL loop dynamics.

It is noted that the multi-elements dividers, with 4 dividers, can be used to accurately produce the fractional division ratio of N+0.25, as well as N+0.5 and N+0.75. For example, N+0.5 can be realized by having 2 dividers performing divide-by-3 and the other 2 dividers performing divide-by-4, and N+0.75 can be realized by having 1 divider performing divide-by-3 and the other 3 dividers performing divide-by-4. To this end, an M-element divider array can accurately produce a division ratio in the form of (N+k/M), where k is an integer from 0 to M−1 and the step in the division ratio is 1/M. For example, to generate a fractional division ratio of 3.14 (e.g., π), the ΔΣ modulator may be configured with a quantization step size of 1/4 assuming M=4, and the division ratio switches between 3 and 3.25.

To facilitate proper operation, the rising edges of all divider outputs, in some embodiments, are shaped to be similar, if not identical, to the reference clock rising edges, ensuring that all phase-frequency detectors (PFDs) work in the linear region from −2π to 2π. This design constraint prevents the phase difference between any divider output and the reference clock from operating beyond the linear range to the nonlinear region that can lead to the failure of the spatial averaging operation. To facilitate the rising edge of each divider output to be similar to the reference clock when PLL is in lock, in some embodiments, every divider output frequencies is made identical to the reference clock. To this end, in some embodiments, a divider cannot be statically set to a given division value while another divider is statically set to another division value—this would lead to the divider output frequencies being unequal. Because phase may be considered as an integration of frequency; by bounding the phase difference, frequency difference is also made zero.

To produce the right selection pattern, in some embodiments, the condition of Equation 1 is ensured.

$$-N-\alpha < \Sigma_{i=1}^{+\infty}(W_K[i]-N-\alpha) < N+\alpha \qquad \text{(Equation 1)}$$

where Wj[i] represents the division ratio of the K-th divider during the i-th reference clock cycle. Equation 1 ensures that the accumulated phase difference between the divider output and the reference clock are within one reference clock cycle. In some embodiments, to produce the right selection pattern, Equation 2 is also ensured.

$$\frac{\sum_{K=1}^{M} W_K[i]}{M} = d[i] \qquad \text{(Equation 2)}$$

where d[i] represents the i-th output of the fine ΔΣ modulator and where d[i] is (N+α) plus the ΔΣ modulator quantization error.

Figure 8:
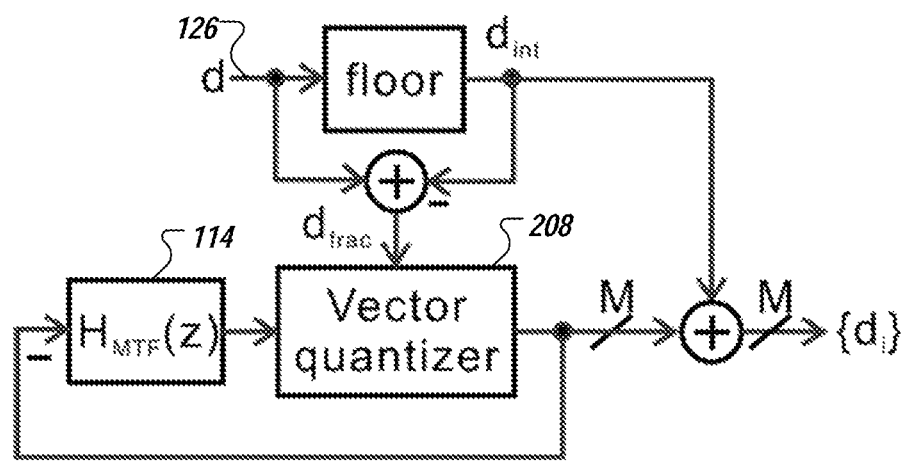
FIG. 8 shows a block diagram of a dynamic element matching (DEM) circuit configured with a vector quantizer (VQ), in accordance with an illustrative embodiment.

As stated above, in some embodiments, a vector quantizer is implemented to shape the mismatch errors to higher order. FIG. 8 shows a block diagram of the dynamic element matching (DEM) circuit 122 configured with a vector quantizer (VQ) 208, in accordance with an illustrative embodiment. As shown in FIG. 8, a loop filter $H_{MTF}(z)$ 114 is implemented. In some embodiments, the loop filter $H_{MTF}(z)$ 114 is a simple accumulator that implements data weighted averaging (DWA) with first-order high-pass shaping. Higher order shaping can be realized by increasing the order of $H_{MTF}(z)$.

Linear Model of Fractional-N PLL with Multi-Element Fractional Divider

Figure 9:
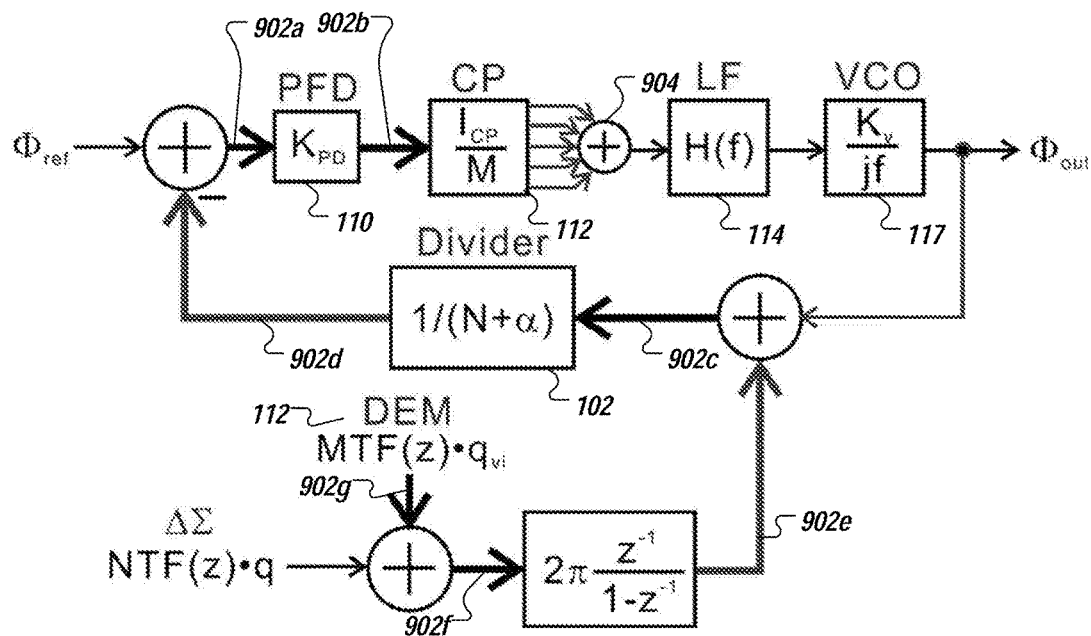
FIG. 9 shows a linear phase-domain model for the fractional-N phase lock loop circuit of FIG. 1, in accordance with an illustrative embodiment.

FIG. 9 shows a linear phase-domain model 900 for the fractional-N phase lock loop circuit of FIG. 1, in accordance with an illustrative embodiment. As shown in FIG. 9, the model 900 includes the plurality of phase-frequency detectors 110, the plurality of charge pumps 112, the loop filter 114, and the voltage-controlled oscillator 117. In this diagram, thick wires 902 (shown as 902a, 902b, 902c, 902d, 902e, 902f, 902g) indicate an array of wires that are used to connect to respective components.

Referring still to FIG. 9, each of the plurality of phase-frequency detectors 110 is modeled as a gain, $K_{PD}$. Each of the plurality of charge pumps 112 is modeled as the total pump current, $I_{CP}$, that is divided by the number of charge pump elements M. A summation block 904 is shown to follow the CP array to model the summation of the charge domain from each respective charge pump. A closed-loop transfer function of the linear phase-domain model 900 is provided in Equation 3 where A(f) is a open-loop transfer function of the PLL as provided in Equation 4.

$$G(f) = \frac{A(f)}{1+A(f)} \qquad \text{(Equation 3)}$$

$$A(f) = K_{PD} \cdot I_{CP} \cdot H(f) \cdot \frac{K_V}{jf} \cdot \frac{1}{N+\alpha} \qquad \text{(Equation 4)}$$

In Equation 4, $K_{PD}$ is the phase-frequency detector (PFD) gain; H(f) is the loop filter transfer function; $K_V$ is the VCO tuning gain; and N+α is the fractional division ratio. The PLL does not change the loop response, such as the loop bandwidth and settling time—this is later shown via simulation results. The closed-loop transfer function of the fractional-N quantization error of the fractional-N phase lock loop circuit has a magnitude of the quantization error q that is M times smaller than that of conventional PLL due to the fine quantization.

The dynamic element matching (DEM) block 112 is shown as a feedback loop having a vector quantizer in which the i-th vector quantization error is represented as $\{q_{v,i}\}$, and the closed-loop transfer function of the dynamic element matching (DEM) block 112 is represented as MTF(z) (where "MTF" refers to mismatch transfer function). The summation of the vector quantization error $\{q_{v,i}\}$ is desired to be zero. By assuming there is no mismatch in the current source, the vector quantization errors will cancel out naturally in the charge domain at the output of the charge pump array and, thus, vector quantization error does not contribute any noise to the PLL output.

Discussion of Mismatched Errors

Figure 10:
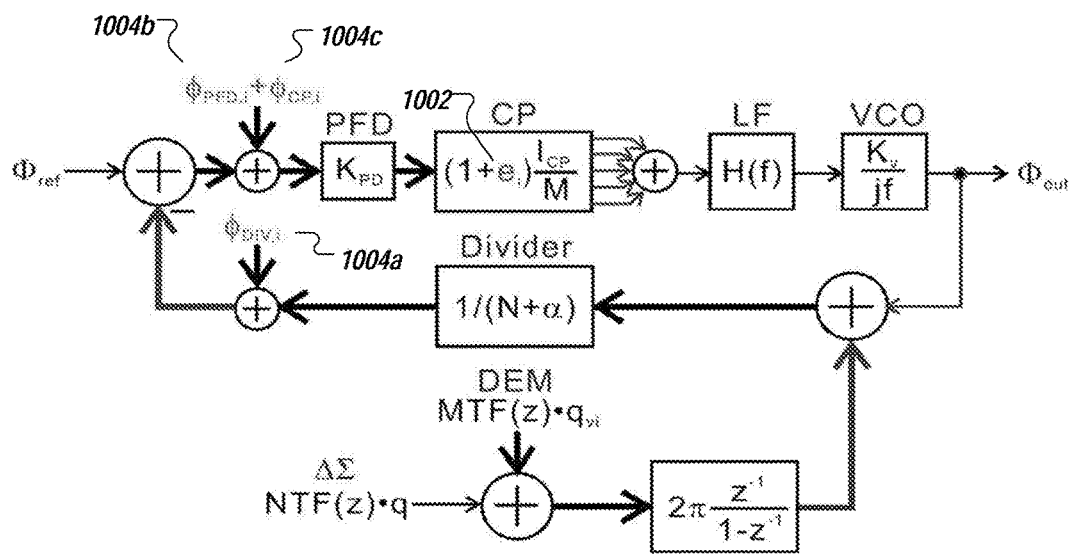
FIG. 10 shows the PLL linear phase-domain model configured with noise to model non-idealities, in accordance with an illustrative embodiment.

FIG. 10 shows the PLL linear phase-domain model 900 configured with noise to model non-idealities such as those due to mismatched among individual elements of the arrays of phase-frequency detectors (PFDs), charge pumps (CPs), and dividers, among others. With respect to gain error, the mismatch errors is broadly classified as two types: amplitude mismatch, which acts as gain errors in the phase domain, and delay mismatch, which acts as offsets in the phase domain. Because phase-domain of gains of phase-frequency detectors (PFDs) and dividers are generally fixed due to the topology of the components and their respective operations, there are no gain errors in phase-frequency detector (PFD) and divider arrays. Gain error may occur in the charge pump array due, for example, to current source mismatches. In FIG. 10, $e_i$ (shown as 1002) is used to represent a percentage mismatch in the current amplitude of the i-th charge pump. For simplicity, the total charge pump current is defined with mismatch as $I_{CP}$ where $\Sigma_{i=1}^{M} e_i = 0$. To this end, the PLL closed-loop transfer function is unchanged and, thus, the transfer functions of the reference clock phase noise, VCO phase noise, and the fractional-N quantization noise remain the same while the vector quantization error $\{q_{v,i}\}$ is affected. As mentioned earlier, if there is no mismatch, the vector quantization error does not show up at the PLL output because their summation is 0 by definition. However, since each $q_{v,i}$ is now multiplied by an unequal gain of $(1+e_i)$ in the CP array, the summation of the product $(1+e_i)q_{v,i}$ is no longer zero. Thus, the non-zero part of $\Sigma_{i=1}^{M}(e_i \cdot q_{v,i})$ appears at the PLL output as phase noise, and its transfer function is given by the mismatch transfer function MTF(z) multiplying the quantization noise transfer function.

In some embodiments in which the fractional-N phase lock loop circuit is implemented with a data weighted averaging (DWA), the CP mismatch induced error can be modeled, in the in-band frequencies, as white noise at the PLL output. Specifically, because the mismatch transfer function MTF(z) can be approximated by $(1-z^{-1})$, the natural frequency-to-phase integration in the divider (shown as the block of $2\pi \cdot z^{-1}/(1-z^{-1})$ is canceled out.

With respect to offset errors, for any divider, phase-frequency detector (PFD), and charge-pump (CP) element in the array, there may be a delay mismatch shown as divider-element offset-error, $\phi_{DIV,i}$ 1004a; phase-frequency detector (PFD) offset-error, $\phi_{PFD,i}$ 1004b; and CP offset-error, $\phi_{CP,i}$ 1004c. For example, in a divider, the D flip-flops may have a slightly different clock-to-Q delay. These delay mismatches can act as offset errors in the phase domain and are represented as $\phi_{DIV,i}$, $\phi_{PFD,i}$, and $\phi_{CP,i}$ in FIG. 10. The effects of these delay mismatches can be ignores as long as these delay errors are small (so as to only cause a slight phase shift in the final PLL output) such that the phase-frequency detectors (PFDs) continue to operate in the linear region.

Discussion of Fractional-N Phase Lock Loop Circuits

Unlike integer-N phase lock loops (PLLs), fractional-N PLLs allow synthesis of frequencies that are a fraction of the reference. Thus, it allows a higher reference frequency and a wider PLL bandwidth, which leads to faster settling time and stronger suppression of VCO noise. However, fractional-N PLL have an additional noise source in the form of quantization error from $\Delta\Sigma$ modulator used to generate the fractional division ratio.

There have been several techniques to address this issue. An analog approach is to inject current into the charge pump to cancel out the quantization noise—this is, for example, described in Swaminathan, A. et al., "A widebandwidth 2.4 GHz ISM-band fractional-N PLL with adaptive phase noise cancellation", IEEE JSSC, pp. 2639-2650, 2007. However, it requires a high-resolution digital-to-analog converter (DAC) along with accurate gain and offset calibration techniques. A multi-phase ring VCO can also be used to cancel the quantization noise—this is, for example, described in Sidiropoulos, S. et al., "A semidigital dual delay-locked loop", IEEE JSSC, pp. 1683-1692, 1997—but it requires complicated phase realignment technique. Another example approach is to use an FIR filter at the $\Delta\Sigma$ modulator output—this is described in Yu, X. et al., "An FIR-embedded noise filtering method for $\Delta\Sigma$ fractional-N PLL clock generators", IEEE JSSC, pp. 2426-2436, 2009. Though it is mostly digital, it is effective only at high frequencies. It is observed that for a wide-band PLL, a large number of FIR filter taps are required to adequately suppress the quantization noise.

The methods and apparatuses disclosed herein facilitates a mostly digital technique that significantly reduces the quantization noise at all frequencies and that requires less digital components. To this end, compared to, for example, the FIR filtering technique and other techniques, discussed above, the methods and apparatuses disclosed herein achieves a significant improvement (e.g., up to 18 dB for an 8-element divider) in performance while incurring only a small increase in hardware complexity.

Experimental Results of Fractional-N Phase Lock Loop Circuits

Figure 11:
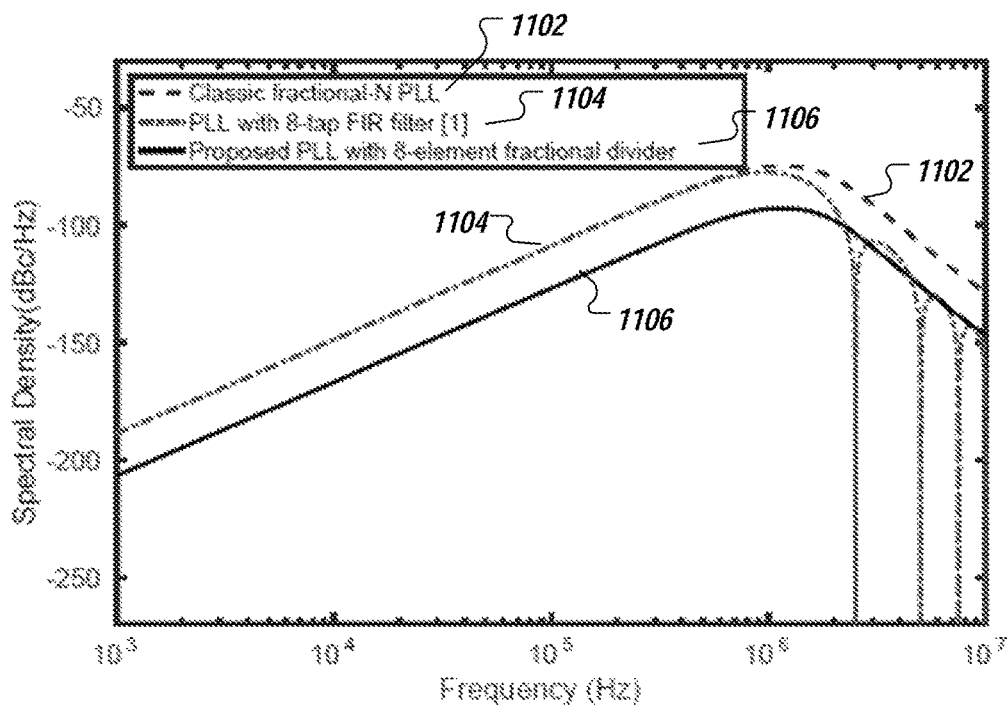
FIGS. 11 and 12 are diagrams illustrating simulated results comparing quantization noise, as a function of frequency, in a conventional ΔΣ modulator having a single divider, a ΔΣ modulator with 8-tap FIR filter, and the fractional-N phase lock loop circuit of FIGS. 1 and 7, respectively.
Figure 12:
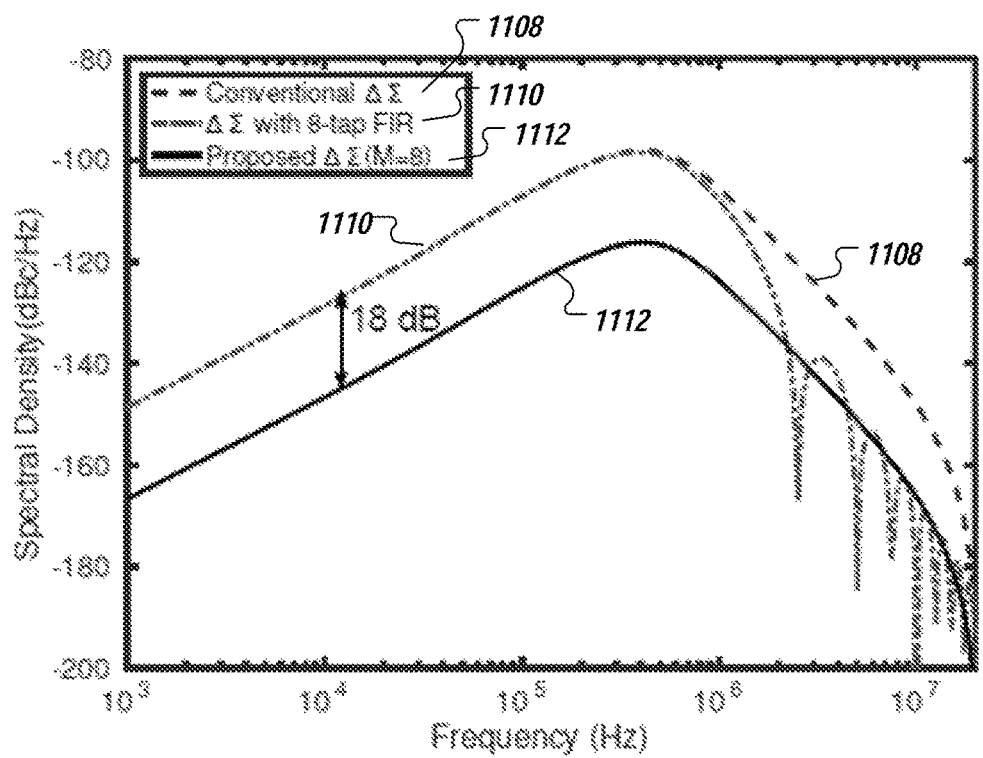

FIGS. 11 and 12 are diagrams illustrating simulated results comparing quantization noise, as a function of frequency, in a conventional $\Delta\Sigma$ modulator, a $\Delta\Sigma$ modulator with 8-tap FIR filter, and the fractional-N phase lock loop circuit of FIGS. 1 and 6, respectively.

Each of FIGS. 11 and 12 compares results of the phase noise for a classic fractional-N PLL (i.e., a fractional-N PLL with a single divider component) (shown as 1102), a comparative PLL exemplified fractional-N PLL with a multiple element fractional divider (e.g., having an 8-element divider) (shown as 1106), using a linear phase-domain PLL model. An example of the FIR filtering PLL used in the simulation is described in Yu et al., "An FIR-embedded noise filtering method for $\Delta\Sigma$ fractional-N PLL clock generators", IEEE JSSC, pp. 2426-2436, 2009.

In FIG. 11, the fractional-N PLL is designed to have a third-order loop filter, a closed-loop bandwidth of 1 MHz, and a reference frequency of 20 MHz. It can be seen from FIG. 11 that the FIR filter only suppresses the quantization noise beyond 1 MHz. By contrast, the exemplified fractional-N PLL (e.g., of FIG. 1) with a multiple element fractional divider (i.e., 8-element divider) suppresses the quantization noise by 18 dB over the entire frequency range and substantially outperforms the FIR filtering PLL.

In addition, another advantage of the exemplified fractional-N PLL is that the ripple in the VCO control voltage is much smaller than that in a conventional fractional-N PLL. This is because the quantization error has been greatly reduced. This can greatly relax the linearity requirement for the charge pump and the VCO, leading to significantly reduced quantization noise folding effect and spur. Spurs refers to spurious signal of measurable discrete, deterministic, and periodic interface noise in a signal's noise spectrum.

The hardware cost for the exemplified fractional-N PLL includes, in some embodiments, a fine-resolution quantizer in the $\Delta\Sigma$ modulator, the dynamic element matching (DEM) block, and multiple copies of the divider and phase-frequency detector (PFD). The increased hardware, in some embodiments, is entirely digital and entails very low cost in terms of design effort as well as area and power especially for designs in advanced technology.

In FIG. 12, the exemplified fractional-N PLL of FIG. 6 is designed to have a closed loop bandwidth of 0.5 MHz and a reference frequency of 20 MHz. A third-order loop filter was used for the simulations. It can be seen from FIG. 12 that the FIR filter (shown as 1110) only suppresses the quantization noise beyond 1 MHz. The exemplified fractional-N PLL of FIG. 6 technique (shown as 1108) over the entire frequency range and also outperforms the FIR filtering technique.

Simulation Results of Fractional-N Phase Lock Loop Circuits

To evaluate and verify the performance of the exemplified fractional-N PLL of FIG. 1, a type-II, third-order $\Delta\Sigma$ fractional-N PLL was implemented in simulation, via Simulink. The reference frequency is 20 MHz and the PLL bandwidth is 1 MHz. A third-order (i.e., 8-bit) $\Delta\Sigma$ modulator was used to generate a division ratio of 10.57. For simplicity, quantization noise from the $\Delta\Sigma$ modulator is the only source of noise in the simulations. The VCO frequency is down-converted to 20 MHz and the output spectra for different techniques are plotted in FIG. 9.

Figure 13A:
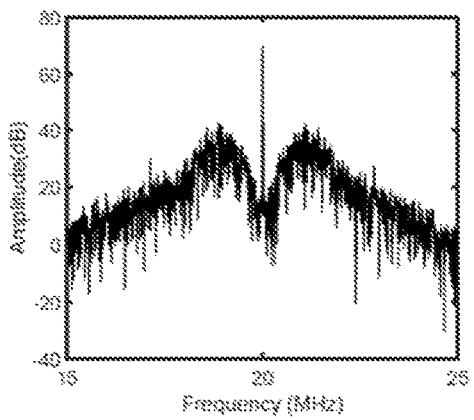
FIGS. 13A, 13B, 13C, and 13D are diagrams illustrating simulated results comparing VCO output spectrums in a conventional ΔΣ modulator (FIG. 9A), a ΔΣ modulator with 8-tap FIR filter (FIG. 9B), the fractional-N phase lock loop circuit of FIG. 1 (FIG. 9C), and the fractional-N phase lock loop circuit of FIG. 1 with 3σ mismatch (FIG. 9D).
Figure 13B:
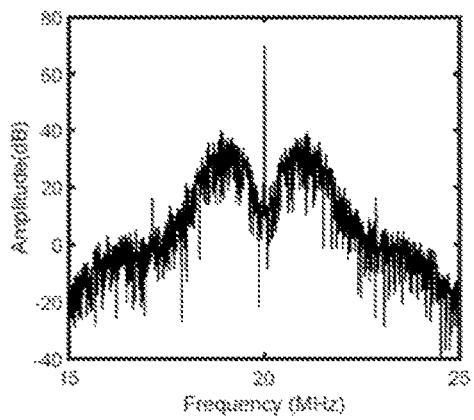
Figure 13C:
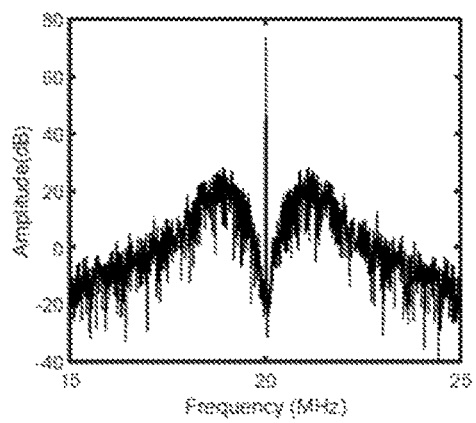
Figure 13D:
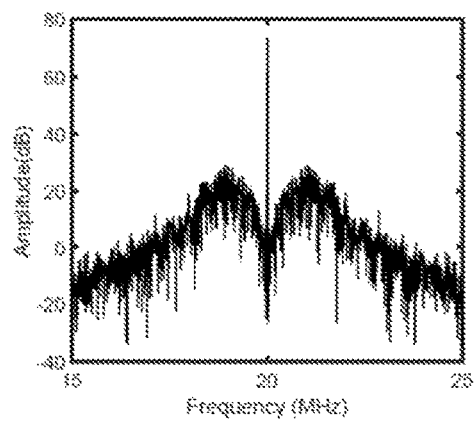

FIGS. 13A, 13B, 13C, and 13D are diagrams illustrating simulated results comparing VCO output spectrums in a conventional $\Delta\Sigma$ modulator (FIG. 13A), a $\Delta\Sigma$ modulator with 8-tap FIR filter (FIG. 13B), the fractional-N phase lock loop circuit of FIG. 1 (FIG. 13C), and the fractional-N phase lock loop circuit of FIG. 1 with 3σ mismatch (FIG. 13D).

As can be seen from FIG. 13A, the conventional fractional-N PLL has large quantization noise and appreciable spur. The FIR filtering technique can suppress the quantization noise but only at high frequencies [see FIG. 13B]. In contrast, the fractional-N PLL with multiple-element divider (e.g., an 8-element divider) suppresses noise across all frequencies by 18 dB, which matches the analysis using linear model (as described in relation to FIG. 9A). To further validate the proposed technique in the presence of device mismatches, a 3σ mismatch of 15% is added to the charge pump slices. The simulation result of FIG. 13D shows no noticeable degradation, which is enabled by the dynamic element matching (DEM) block 122. The simulated RMS jitters for the conventional fractional-N PLL, the FIR filtering technique, and the exemplified fractional-N PLL with and without mismatches, are 188 ps, 126 ps, 25 ps, and 23 ps, respectively. This again shows that the exemplified fractional-N PLL can reduce jitter by 8 times in this example. Note that the phase noise and jitter can be further reduced by increasing the number of slices and the fractional divider resolution. The trade-off is hardware complexity.

Figure 14:
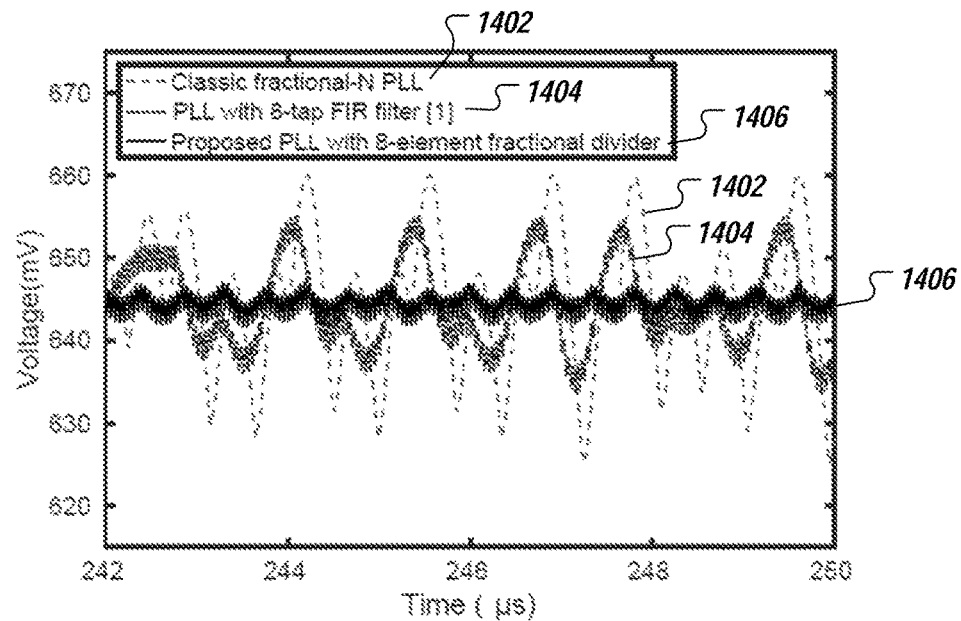
FIG. 14 depicts a diagram of a simulated result of a VCO control voltage transient, of the fractional-N PLL of FIG. 1, at lock.

FIG. 14 depicts a diagram of a simulated result of a VCO control voltage transient, of the fractional-N PLL of FIG. 1, at lock. Specifically, FIG. 14 shows the VCO control voltage at lock for three different cases: the conventional fractional-N PLL (shown as 1402), the FIR filtering technique (shown as 1404), and the exemplified fractional-N PLL (shown as 1406). As shown, the ripple of the exemplified fractional-N PLL is only 1/8 of the conventional PLL, and is also significantly smaller than that of the FIR filtering technique and the conventional fractional-N PLL.

To evaluate and verify the performance (e.g., the quantization noise reduction) of the exemplified fractional-N PLL of FIG. 6, a type-II, third-order ΔΣ fractional-N PLL was implemented in simulation, via Matlab Simulink. A phase-frequency detector (PFD) frequency of 20 MHz was selected and the PLL bandwidth was set at 0.5 MHz. A second-order ΔΣ modulator was used to generate a division ratio of 41.2. The VCO frequency was down-converted to 20 MHz and the spectra for different techniques are plotted in FIGS. 15A-15D.

FIGS. 15A, 15B, 15C, and 15D are diagrams illustrating simulated results comparing VCO output spectrums in a conventional ΔΣ modulator (FIG. 15A), a ΔΣ modulator with 8-tap FIR filter (FIG. 15B), the fractional-N phase lock loop circuit of FIG. 9A (FIG. 15C), and the fractional-N phase lock loop circuit of FIG. 9A with 3σ mismatch (FIG. 15D).

As shown, quantization noise from the ΔΣ modulator is the sole source of noise in the simulations. FIG. 15A shows the spectrum of conventional ΔΣ modulator. The fractional spurs at offsets of 4 MHz and its multiples can be clearly seen. The fractional spur at 4 MHz is 53.6 dB below the carrier. The FIR filtering technique, shown in FIG. 15B, suppress the fractional spurs further and the spur at 4 MHz offset is 69.7 dB below the carrier. The exemplified fractional-N PLL with a multiple element divider (e.g., an 8-element divider), shown in FIG. 15C, suppresses even when a charge pump 3σ mismatch of 15% is included in the simulation, as can be seen in FIG. 15D. FIG. 16 depicts a diagram of a simulated result of a VCO control voltage transient, of the fractional-N PLL of FIG. 6, at lock. Specifically, FIG. 16 shows the VCO control voltage at lock for fractional-N PLL with conventional ΔΣ modulator and the exemplified fractional-N PLL. As shown in FIG. 16, it can be clearly seen that the exemplified fractional-N PLL significantly reduces the ripple on the VCO control voltage.

Method of Operation

Figure 17:
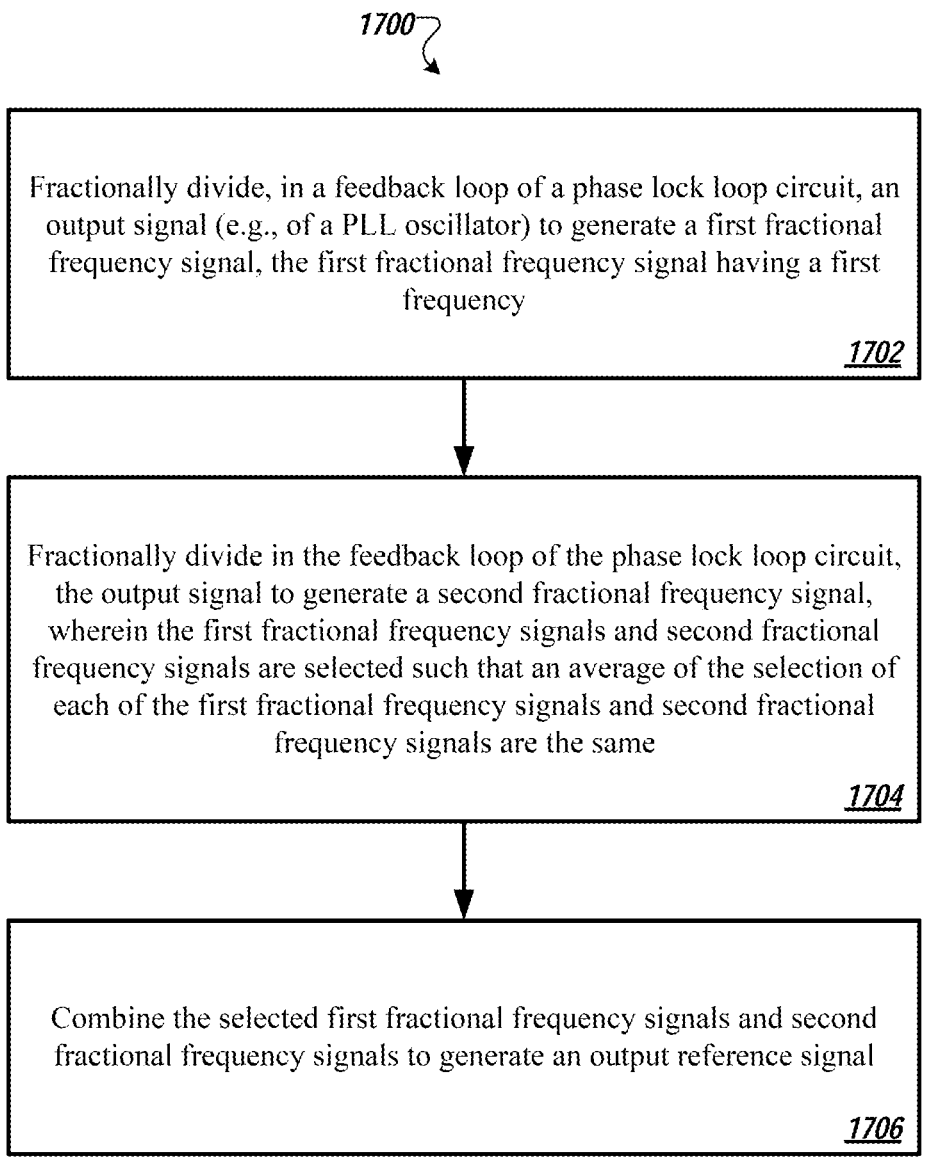
FIG. 17 depicts a flow diagram of a method for synthesizing an output signal (e.g., a PLL or CLK signal), having an output frequency, from an input reference signal having an input reference frequency, wherein the output frequency has a fraction ratio (e.g., N+α, wherein N is an integer and α is a fraction value) to the input reference frequency, in accordance with an illustrative embodiment.

FIG. 17 depicts a flow diagram of a method 1700 for synthesizing an output signal (e.g., a PLL or CLK signal), having an output frequency, from an input reference signal having an input reference frequency, wherein the output frequency has a multiplication factor (e.g., N+α, wherein N is an integer and α is a fraction value) to the input reference frequency, in accordance with an illustrative embodiment.

The method 1700 includes, at step 1702, fractionally dividing, in a feedback loop (e.g., 104) of a phase lock loop circuit (e.g., 100), an output signal (e.g., output signal 130) to generate a first fractional frequency signal (e.g., 118), the first fractional frequency signal (e.g., 118) having a first frequency. In some embodiments, the step 1302 is performed via a first set of one or more divider circuits (e.g., 502, 602) as, for example, described in relation to FIGS. 1, 5, and 6.

The method 1700 includes, at step 1704, fractionally dividing, in the feedback loop of the phase lock loop circuit (e.g., 100), the output signal (e.g., the output signal 130) to generate a second fractional frequency signal (e.g., 118), the second fractional frequency signal (e.g., 118) having a second frequency, wherein the first frequency is not the same as the second frequency, and wherein the first fractional frequency signals and second fractional frequency signals are selected such that an average distribution of the selection of each of the first fractional frequency signals and second fractional frequency signals are the same. In some embodiments, the step 1304 is performed via a second set (e.g., 504, 604 or 606) of one or more divider circuits as, for The method 1700 includes, at step 1706, combining the selected first fractional frequency signals (e.g., 118) and second fractional frequency signals (e.g., 118) (e.g., via a synthesis portion 106 of a PLL circuit) to generate the output signal (e.g., a PLL or CLK signal).

In some embodiments, the method 1700 includes simultaneously generating (e.g., via a dynamic element matching (DEM) circuit) a signal to select, at each given period, one or more first fractional frequency signals and second fractional frequency signals, wherein the generated signals has an average distribution among the selection of each of the first fractional frequency signals and second fractional frequency signals that are the same to one another.

Space-Time Fractional-N Digital Phase Lock Loop Circuit

Figure 18:
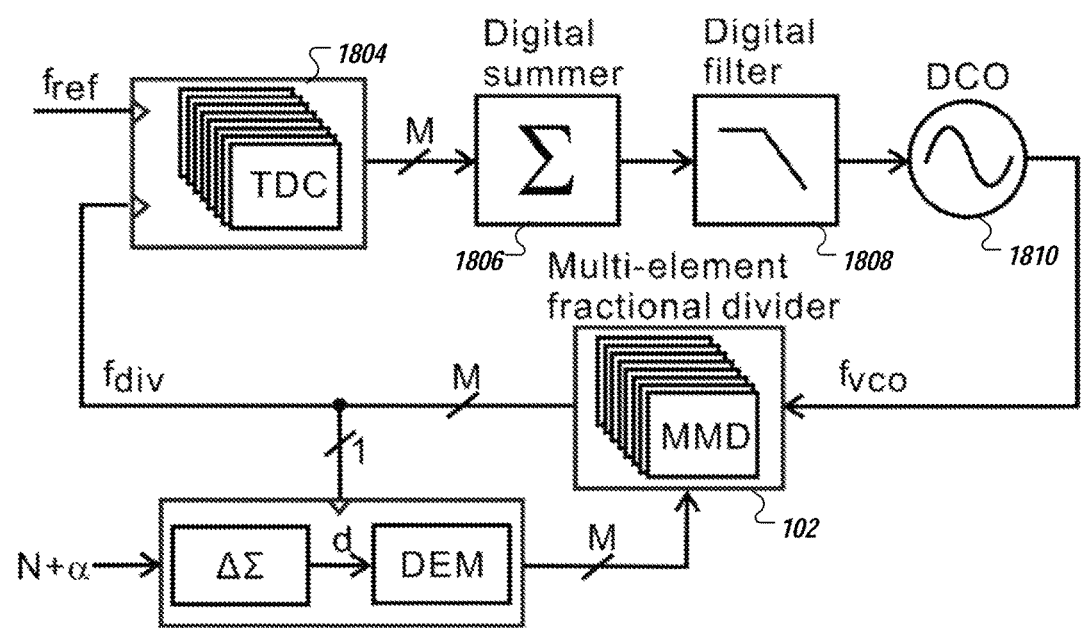
FIG. 18 is a diagram of a fractional-N phase lock loop circuit (DPLL) implemented with digital components, in accordance with an illustrative embodiment.

FIG. 18 is a diagram of a fractional-N digital phase lock loop circuit (DPLL) 1102 with spatial averaging operations implemented only with digital components. The fractional-N digital phase lock loop circuit (DPLL) 1102 also uses spatial averaging to reduce the fractional-N quantization error, as discussed in relation to the fractional-N PLL of FIGS. 1-6. The fractional-N digital phase lock loop circuit (DPLL) 1102 is shown analogous to the circuit shown in FIG. 1.

Referring to FIG. 18, the fractional-N phase lock loop circuit (DPLL) 1102 includes a set of time-to-digital converters (TDCs) 1104 (e.g., high performance time-to-digital converters) along with a set of digital summer circuits 1106. In some embodiments, the set of time-to-digital converters 1104 and set of summers 1104 are configured in an array. The fractional-N digital phase lock loop circuit (DPLL) 1102 further include as a digital filter 1108 and a digitally controlled oscillator (1) 1110.

Among other reasons, this implementation can beneficially leverage benefits of CMOS technology scaling. It can also greatly reduce circuit area and power with charge pump and bulky loop filters replaced with equivalent digital circuits. The digital nature of DPLL also makes it more robust against PVT variations than analog PLL.

The fractional-N phase lock loop circuit (DPLL) 1102, in some embodiments, is and digitally controlled oscillator (DCO), via space-time averaging operations, such that the time-to-digital converter (TDC) can support a wide swing covering at least one VCO period and such that the TDCs have high-resolution and high-linearity in which quantization noise is prevented from folding into the PLL band and such that digitally controlled oscillators (DCOs) can operate at sufficient levels of linearity in view of static mismatch and dynamic switching errors. In some embodiments, the fractional-N digital phase lock loop circuit (DPLL) 1102 is configured as a wide-band low-jitter fractional-N DPLL. These wide-band low-jitter fractional-N DPLLs can be used, in some embodiments, in energy-sensitive system-on-a-chip (SoC) built in advanced CMOS processes.

Notably, the spatial averaging operations can improve both TDC resolution and linearity during operation (e.g., over conventional DPLLs) without need for calibration of the mainly digital components.

With respect to time-to-digital converters (TDC) resolution, because the time-to-digital converters (TDCs) 1104 are implemented with M copies, the respective quantization errors of each of the time-to-digital converters (TDCs) are uncorrelated with the average of the aggregated outputs of the time-to-digital converters (TDCs) reducing the time-to-digital converters (TDC) quantization noise power by M times and leading to increased time-to-digital converters (TDC) resolution. In addition, with M copies of the dividers 102, the fractional-N quantization noise is reduced by $M^2$ times.

With respect to time-to-digital converters (TDC) linearity, the time-to-digital converters (TDC) linearity is improved with spatial averaging because once the PLL is locked, the reference clock naturally stays close to the arithmetic mean of the divider output edges that naturally leads to a cancellation of the majority of the dominant third-order time-to-digital converters (TDC) nonlinearity. That is, while some time-to-digital converters (TDC) slices can observe positive inputs, for example, as a reference clock that leads the divider output, other time-to-digital converters (TDC) slices would observe a corresponding negative inputs as reference clock lagging the divider output.

To address dynamic digitally-controlled-oscillator (DCO) capacitor-switching error, the instantaneous transition rate of any capacitor inside the digitally controlled oscillator (DCO) is ensured to be independent of the digital control signal. In some embodiments, a feedback loop is used to guarantee that the all capacitor elements are used uniformly to simultaneously suppress the static mismatch error.

Figure 19A:
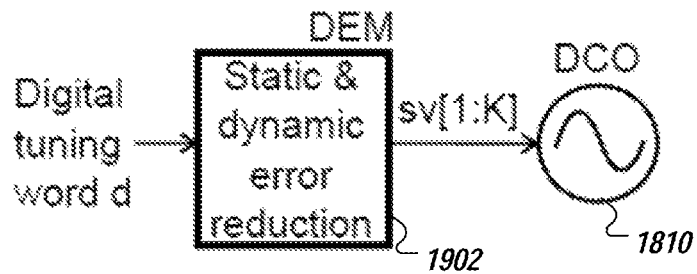
FIGS. 19A, 19B, and 19C are diagrams of a DEM processes for a low-noise and low-distortion DCO, in accordance with an illustrative embodiment.
Figure 19B:
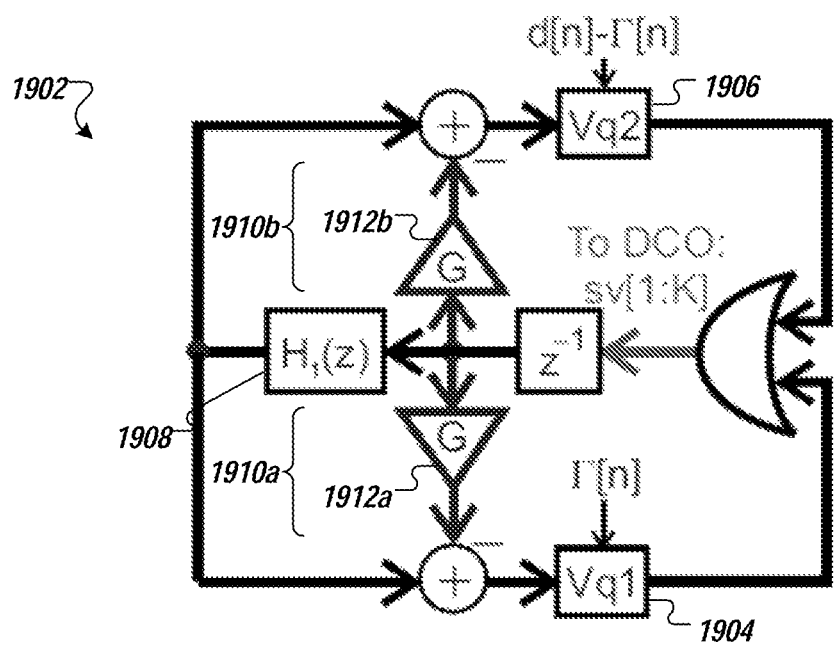
Figure 19C:
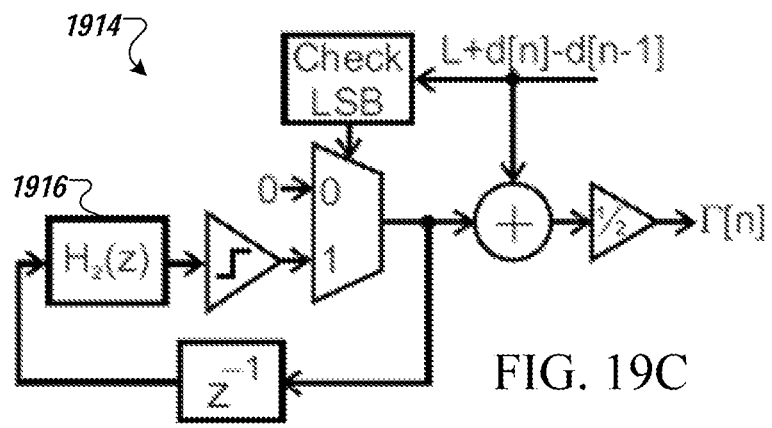

FIGS. 19A, 19B, and 19C are diagrams of a dynamic element matching (DEM) circuit 1902 configured for a low-noise and low-distortion digitally controlled oscillator (DCO) 1810, in accordance with an illustrative embodiment.

Static mismatch can cause non-monotonicity in DCO tuning, resulting in PLL loop instability. Dynamic switching error can result from unmatched arrival times and rise/fall times of the digital signals controlling the digitally-controlled-oscillator (DCO) frequency, leading to large digitally-controlled-oscillator (DCO) nonlinearity. Dynamic switching error are often proportional to the digitally-controlled-oscillator (DCO) capacitor element switching rate. By scrambling the capacitor selection pattern and ensuring the long-term usage rates are the same for all capacitor elements in the same segment, using the dynamic element matching (DEM) techniques discussed herein, the mismatch errors can be high-pass shaped and moved out of then PLL band.

To simultaneously suppress the static mismatch error, a feedback loop is used to guarantee that the all capacitor elements are used uniformly. As shown in FIG. 19A, a DEM block is inserted between the DCO digital tuning word d from the digital loop. For a capacitor array with K elements, the DEM selects the capacitors in the n-th cycle in the following fashion: 1) it turns on Γ[n] unselected unit capacitors that have been least frequently used; and 2) it keeps on (d[n]−Γ[n]) selected unit capacitors that have been least frequently used. Γ[n] is the logic that can satisfy these two requirements. As shown in FIG. 19B, the DEM logic 1902 includes two vector quantizers (VQs): $V_{q1}$ (1904) and $V_{q2}$ (1906). $H_1(z)$ is an integrator 1908 used to count the capacitor element usage rates, and the feedforward paths (shown as 1910a and 1910b) with gain G (shown as 1912a and 1912b) are used to tell VQs 1904, 1906 which elements are used in the most recent cycle. A circuit 1914 that generates Γ[n] with a high-pass spectrum and without distortion is shown in FIG. 19C, where L indicates the target average transition rate and the feedback loop around the integrator $H_2(z)$ 1916 ensures high-pass shaping.

Discussion of Space-Time Fractional-N Digital PLL

Despite all the advantages associated with a digital design, there can be significant challenges when designing a high-performance wide-band fractional-N DPLL. Without wishing to be bound to a particular theory, there can be large divider quantization errors in a fractional-N DPLL as well as requirements of high-performance time-to-digital converter (TDC) and digitally controlled oscillator (DCO)—both of which are nontrivial. Without wishing to be bound to particular theory, these limitations may have prevented state-of-the-art fractional-N DPLLs from matching the performance of their analog PLL counterparts. The TDC of a fractional-N DPLL, because of the presence of the large quantization error, may need to support a wide input swing covering at least one VCO period and have both high-resolution and high-linearity to prevent quantization noise folding into the PLL band. This can be very challenging in certain implementations. Space-time averaging architecture, as discussed herein, can greatly enhance the TDC performance by not only increasing TDC resolution but also reduce its nonlinearity.

Space-time averaging operation, e.g., in the fractional-N phase lock loop circuit (DPLL) 1102, can be used to suppress quantization noise and, e.g., does not require circuits that require calibration. In some embodiments, to reduce the quantization noise without reducing the BW, a cancellation circuit is used after the TDC in which the TDC is configured to have zero gain error to suppress the large phase noise. In some embodiments, a DTC that is carefully calibrated is used after the divider to remove the quantization error.

With regarding to the digitally controlled oscillator (DCO) design, digitally controlled oscillator (DCO) can also be a bottleneck for DPLL where device mismatches can makes it very hard for digitally controlled oscillator (DCO) to achieve high-linearity. Certain DEM techniques can cause large dynamic switching errors, resulting in severe noise/jitter degradation.

Simulation Results of Fractional-N Digital PLL

Figures 20A, 20B:
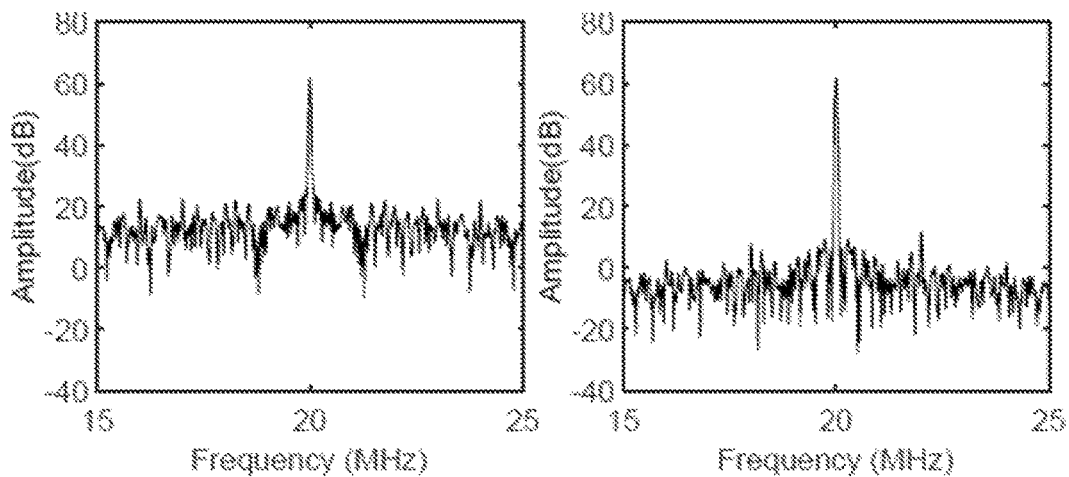
FIGS. 20A, 20B, and 21 show simulations results of the fractional-N digital phase lock loop circuit (PLL) of FIG. 17, in accordance with an illustrative embodiment.
Figure 21:
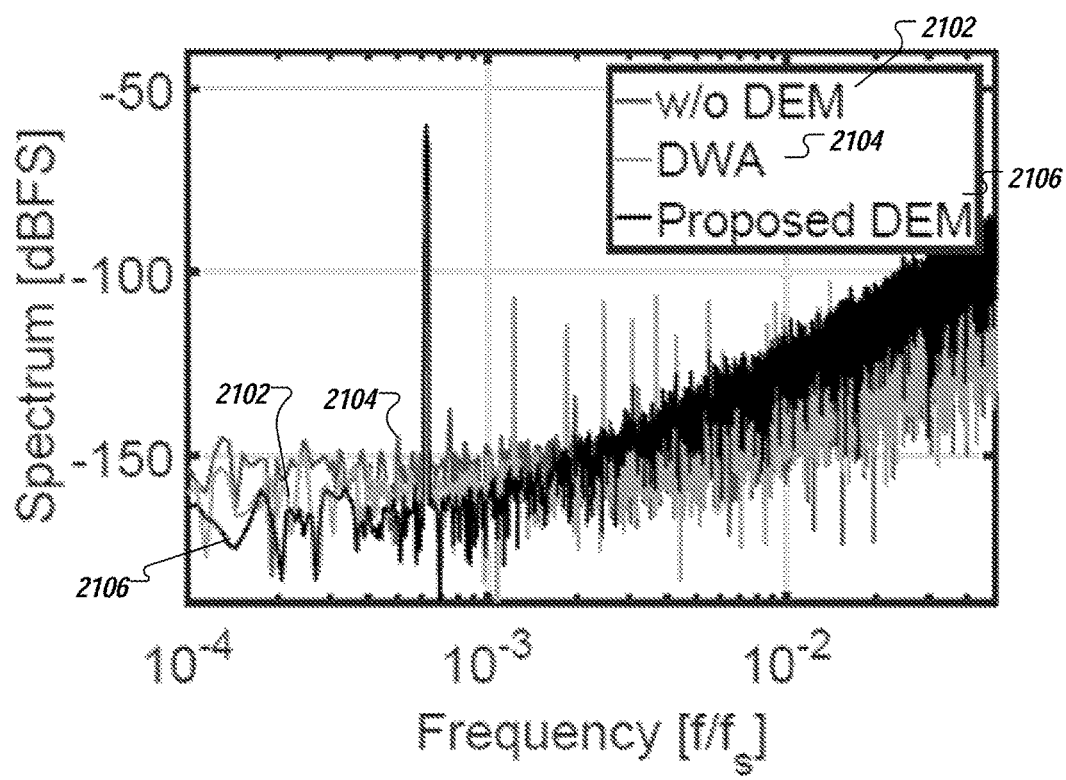

To validate the proposed space-time techniques, two DPLLs were modeled. In each, the same loop parameters are used as in the analog PLL as shown in FIG. 1. FIGS. 20A, 20B, and 21 show simulations results of the fractional-N digital PLL of FIG. 17, in accordance with an illustrative embodiment. Specifically, FIG. 20A shows the spectrum of the down-converted signal for a conventional DPLL circuit.

FIG. 20B shows the spectrum of the space-time averaging DPLL as discussed in relation to FIG. 17 in which M=8 with a 5%-TDC gain mismatch. It is observed that the output space-time averaging DPLL has an 18-dB reduction in phase noise over the conventional DPLL circuit.

To verify the effectiveness of the DEM as described in relation to FIGS. 19A, 19B, and 19C in enhancing digitally controlled oscillator (DCO) linearity, a dynamic element matching (DEM) logic is implemented on a simple digitally controlled oscillator (DCO) model with 512 unit elements. The input digital signal swing is modeled at −60 dBFS to mimic a control voltage swing of the digitally controlled oscillator (DCO) once PLL is in lock. FIG. 21 shows simulations results for the DEM logic of FIGS. 19A, 19B, and 19C with a 2% static capacitor element mismatch error and a 2% dynamic switching error. The results without dynamic element matching (DEM) and for a data weighted averaging (DWA) is also shown.

As shown in FIG. 21, without any DEM (shown with 2102), the digitally controlled oscillator (DCO) spectrum shows distortion and high noise error. Data weighted averaging to increased dynamic error. The dynamic element matching (DEM) logic 1902 of FIGS. 19A, 19B, and 19C is shown to address both static mismatch and dynamic switching errors by reducing the in-band noise error as well as any harmonic distortion. For an oversampling ratio of 10 that mimics filtering operation of a DPLL, the digitally controlled oscillator (DCO) without any dynamic element matching (DEM) (shown via 2102) has an SNDR of 26 dB, data weighted averaging (DWA) (shown via 2104) has an SNDR of 29 dB, while the dynamic element matching (DEM) logic (shown via 2106) has an SNDR of 37 dB. With a reference frequency of 20 MHz and bandwidth of 1 MHz, it is observed that a third-order DPLL loop filter rejects noise beyond 1 MHz frequency. It can also be observed that the dynamic element matching (DEM) logic (via 2106) produces better SNDR than data weighted averaging (DWA) (via 2104 and also much lower harmonic distortion, illustrating the dynamic element matching (DEM) logic in being well suited to address both static mismatch and dynamic switching errors in digitally controlled oscillator (DCO) capacitor array.

While the methods and systems have been described in connection with preferred embodiments and specific examples, it is not intended that the scope be limited to the particular embodiments set forth, as the embodiments herein are intended in all respects to be illustrative rather than restrictive. For example, in some embodiments, the fractional-N PLL is implemented to provide very granular division ratios to generate a highly precision frequency signal. The fractional-N PLL may be implemented with various number of divider circuits greater than two. In some embodiments, the fractional-N PLL includes 4, 5, 6, 7, 8, 9, 10, 11, 12, 13, 14, 15, 16, 17, 18, 19, 20, 21, 22, 23, 24, 25, 26, 27, 28, 29, 30, 31, or 32 divider elements. In some embodiments, the fractional-N PLL includes more than 32 divider elements. In some embodiments, the divider elements may be configured in an array, for example, as a multiple modulus divider (MMD).

The exemplified ΔΣ Fractional-N PLLs may be used radio, telecommunications, ΔΣ Fractional-N PLLs may be implemented, among other things, in an application specific integrated circuit (ASIC), a field programmable gate array (FPGA), a complex programmable logic device (CPLD), and a microprocessor configured with reconfigurable integrated circuits.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is no way intended that an order be inferred, in any respect. This holds for any possible non-express basis for interpretation, including: matters of logic with respect to arrangement of steps or operational flow; plain meaning derived from grammatical organization or punctuation; the number or type of embodiments described in the specification. Throughout this application, various publications are referenced. The disclosures of these publications in their entireties are hereby incorporated by reference into this application in order to more fully describe the state of the art to which the methods and systems pertain.

What is claimed is:

1. A frequency synthesizing circuit configured to synthesize an output signal, having an output frequency, from an input reference signal having an input reference frequency, wherein the output frequency has a multiplication factor to the input reference frequency, the frequency synthesizing circuit comprising:
   a first set of one or more divider circuits, each configured to fractionally divide, in a feedback loop of a phase lock loop circuit, the output signal to generate a first fractional frequency signal, the first fractional frequency signal having a first frequency;
   a second set of one or more divider circuits, each configured to fractionally divide, in the feedback loop of the phase lock loop circuit, the output signal to generate a second fractional frequency signal, the second fractional frequency signal having a second frequency, wherein the first frequency is not the same as the second frequency, and wherein the fractional frequency signals of the first and second sets of divider circuits are selectively combined to generate the output signal; and
   a selector circuit coupled to each of the plurality of divider circuit, the selector circuit configured to generate one or more modulated selection signals to the first and second sets of divider circuits for selection of the output thereof, wherein the modulated selection signals are scrambled by a dynamic element matching circuit to produce an average distribution of the selection of each of the divider circuits of the first and second sets of divider circuits that are the same.

2. The frequency synthesizing circuit of claim 1, wherein the fractional frequency signal generated by each of the first set of one or more divider circuits has a division ratio of N+1 to the output frequency, and wherein the fractional frequency signal generated by each of the second set of one or more divider circuits has a division factor of N to the output frequency.

3. The frequency synthesizing circuit of claim 2, wherein the output frequency of the output signal has a multiplication factor of N+α value to the input reference frequency of the input reference signal, wherein N is an integer and α is a fraction value.

4. The frequency synthesizing circuit of claim 2,
   wherein the first set of one or more divider circuits includes a k number of divider circuits, each configured to output the fractional frequency signal having the division ratio of N+1 to the output frequency, and
   wherein the second set of one or more divider circuits includes a k−M number, each configured to output the fractional frequency signal having the division ratio of N to the output frequency, wherein M is a total number of divider circuits.

5. The frequency synthesizing circuit of claim 1, comprising:
a third set of one or more divider circuits, each configured to output the fractional frequency signal having the division ratio of N+2 to the output frequency; and
a fourth set of one or more divider circuits, each configured to output the fractional frequency signal having the divisional ratio of N−1 to the output frequency,
wherein the fractional frequency signals of the first, second, third, and fourth sets of divider circuits are selectively combined to generate the output signal.

6. The frequency synthesizing circuit of claim 5, wherein each of third set of one or more divider circuits is configured to output the fractional frequency signal having the division ratio of N−1 to the output frequency, and
wherein each of the fourth set of one or more divider circuits is configured to output the fractional frequency signal having the division ratio of N+2 to the output frequency.

7. The frequency synthesizing circuit of claim 1, wherein the first and second sets of one or more divider circuits, collectively, has an average division ratio of $N(1+\alpha)$, wherein $\alpha$ is a fractional part of the division ratio.

8. The frequency synthesizing circuit of claim 1, wherein the selector circuit comprises the dynamic element matching (DEM) circuit comprising:
i) a barrel shifter circuit configured to high-pass shape mismatch errors, among an input modulator signal, to the first order; or
ii) a vector quantizer circuit configured to shape mismatch error, among an input modulator signal, to higher orders.

9. The frequency synthesizing circuit of claim 1, wherein the selector circuit comprises:
the dynamic element matching (DEM) circuit; and
a fractional delta-sigma modulator circuit coupled thereto, wherein the fractional delta-sigma modulator is configured to generate the modulated selection signal.

10. The frequency synthesizing circuit of claim 1, wherein the output signal comprises a fractional-N PLL (phase-lock loop) signal or a fractional-N CLK (clock) signal.

11. The frequency synthesizing circuit of claim 1, wherein a combined number of dividers of the first and second sets of the divider circuits is a number selected from the group consisting of 4, 5, 6, 7, 8, 9, 10, 11, 12, 13, 14, 15, 16, 17, 18, 19, 20, 21, 22, 23, 24, 25, 26, 27, 28, 29, 30, 31, and 32.

12. The frequency synthesizing circuit of claim 1, wherein a combined number of dividers of the first and second sets of the divider circuits is an integer number greater than 24.

13. The frequency synthesizing circuit of claim 1, comprising:
in the feedback loop:
a plurality of phase frequency detectors, each having an input that is coupled to an output of a respective divider circuit of the first and second sets of one or more divider circuits;
a plurality of charge pump element, each having an input that is coupled to an output of a respective phase frequency detector of the plurality of phase frequency detectors;
a loop filter having an input coupled to an output of the plurality of charge pump element; and
a voltage controlled oscillator having an input coupled to an output of the loop filter, wherein an output of the voltage controlled oscillator is coupled to an input of the first and second sets of one or more divider circuits.

14. The frequency synthesizing circuit of claim 1, comprising:
in the feedback loop:
a plurality of time-to-digital converters (TDCs), each having an input that is coupled to an output of a respective divider circuit of the first and second sets of one or more divider circuits;
a plurality of digital summer elements, each having an input that is coupled to an output of a respective time-to-digital converters of the plurality of time-to-digital converters;
a loop filter having an input coupled to an output of the plurality of digital summer elements; and
a digitally controlled oscillator (DCO) having an input coupled to an output of the loop filter, wherein an output of the digitally controlled oscillator is coupled to an input of the first and second sets of one or more divider circuits.

15. The frequency synthesizing circuit of claim 14, wherein the time-to-digital converter (TDC) is configured to support a wide swing covering at least one VCO period, and wherein the time-to-digital converter has a resolution and linearity in which quantization noise is prevented from folding into a PLL band.

16. The frequency synthesizing circuit of claim 14, wherein instantaneous transition rate of any capacitor of the digitally controlled oscillator is ensured to be independent of digital control signal associated with the frequency synthesizing circuit.

17. The frequency synthesizing circuit of claim 14, wherein the digitally controlled oscillator includes a feedback loop that guarantees that the all capacitor elements are used uniformly to simultaneously suppress static mismatch error associated therewith.

18. The frequency synthesizing circuit of claim 1, wherein rising edges of outputs of the first and second set of one or more divider circuits are shaped to be similar to reference clock rising edges so as to ensure that all phase-frequency detectors (PFDs) work in the linear region.

19. The frequency synthesizing circuit of claim 1, wherein each of the divider output frequencies is configured to be identical to a reference clock.

20. A method for synthesizing an output signal, having an output frequency, from an input reference signal having an input reference frequency, wherein the output frequency has a fraction ratio to the input reference frequency, the method comprising:
fractionally dividing, in a feedback loop of a phase lock loop circuit, an output signal to generate a first fractional frequency signal, the first fractional frequency signal having a first frequency;
fractionally dividing in the feedback loop of the phase lock loop circuit, the output signal to generate a second fractional frequency signal, the second fractional frequency signal having a second frequency, wherein the first frequency is not the same as the second frequency, and wherein the first fractional frequency signals and second fractional frequency signals are selected such that an average distribution of the selection of each of the first fractional frequency signals and second fractional frequency signals are the same;
combining the selected first fractional frequency signals and second fractional frequency signals to the input reference signal to generate the output signal;

simultaneously generating, via a dynamic element matching circuit, a scrambled modulated signal to select, at each given period, one or more first fractional frequency signals and second fractional frequency signals, wherein the generated signals has an average distribution among the selection of each of the first fractional frequency signals and second fractional frequency signals that are the same to one another.

* * * * *